United States Patent [19]
Sagara

[11] Patent Number: 5,485,337
[45] Date of Patent: Jan. 16, 1996

[54] THIN FILM MAGNETIC HEAD STRUCTURE AND METHOD OF FABRICATING THE SAME FOR ACCURATELY LOCATING AND CONNECTING TERMINALS TO TERMINAL CONNECTIONS

[75] Inventor: Tomoyuki Sagara, Yamatokoriyama, Japan

[73] Assignee: Sharp Kabushiki Kaisha, Osaka, Japan

[21] Appl. No.: 254,426

[22] Filed: Jun. 6, 1994

Related U.S. Application Data

[63] Continuation of Ser. No. 894,593, Jun. 5, 1992, abandoned.

[30] Foreign Application Priority Data

| Jun. 7, 1991 | [JP] | Japan | 3-136797 |
| Jul. 4, 1991 | [JP] | Japan | 3-163244 |
| May 26, 1992 | [JP] | Japan | 4-133553 |

[51] Int. Cl.$^6$ ............................ G11B 5/147; G11B 5/127
[52] U.S. Cl. ............................................ 360/126; 360/110
[58] Field of Search ................................... 360/125, 126, 360/127, 128, 110, 113; 257/735, 736, 737, 780, 781; 29/603

[56] References Cited

U.S. PATENT DOCUMENTS

| 4,357,640 | 11/1982 | Heinz et al. | 360/119 |
| 4,370,801 | 2/1983 | Roscamp et al. | 29/603 |
| 4,546,541 | 10/1985 | Reid | 360/127 |
| 4,642,716 | 2/1987 | Wakayabashi et al. | 360/104 |
| 4,796,132 | 1/1989 | Dekura et al. | 360/113 |
| 4,855,251 | 8/1989 | Iyogi et al. | 437/183 |
| 4,859,629 | 8/1989 | Reardon et al. | 257/735 |
| 4,927,505 | 5/1990 | Sharma et al. | 257/781 |
| 4,992,897 | 2/1991 | Deroux-Darphin | 360/103 |
| 5,001,542 | 3/1991 | Tsukagoshi et al. | 257/783 |
| 5,108,950 | 3/1992 | Watabayashi et al. | 257/737 |
| 5,134,460 | 7/1992 | Brady et al. | 257/737 |
| 4,370,8902 | 2/1983 | Platter et al. | 29/603 |

FOREIGN PATENT DOCUMENTS

| 59-8116 | 1/1984 | Japan . |
| 59-172106 | 9/1984 | Japan . |
| 60-1614 | 1/1985 | Japan . |
| 61-9815 | 1/1986 | Japan . |
| 63-106910 | 5/1988 | Japan . |
| 01166312 | 6/1989 | Japan . |
| 2244414 | 9/1990 | Japan . |

OTHER PUBLICATIONS

"Thin Film Tape Heads, Analog and Digital Application" from IEEE Transactions on Magnetics, vol. 26, No. 6, Nov.1990; Dohmen et al.; pp. 2983–2988.

*Primary Examiner*—Robert S. Tupper
*Assistant Examiner*—Paul J. Ditmyer

[57] ABSTRACT

A thin magnetic head is formed by a magnetic substrate, an element portion, a protective plate, and the like. A plurality of external connection terminals are arranged on the surface of the magnetic substrate to extend from the element portion. A plurality of lead terminals are arranged in correspondence to respective ones of the external connection terminals. The lead terminals are held between a base film and a cover film or by a glass substrate, so that at least surfaces being opposed to the external connection terminals are exposed. Conductive layers are interposed between the opposed ones of the lead terminals and the external connection terminals respectively. The lead terminals are electrically connected with the external connection terminals by the conductive layer.

32 Claims, 23 Drawing Sheets

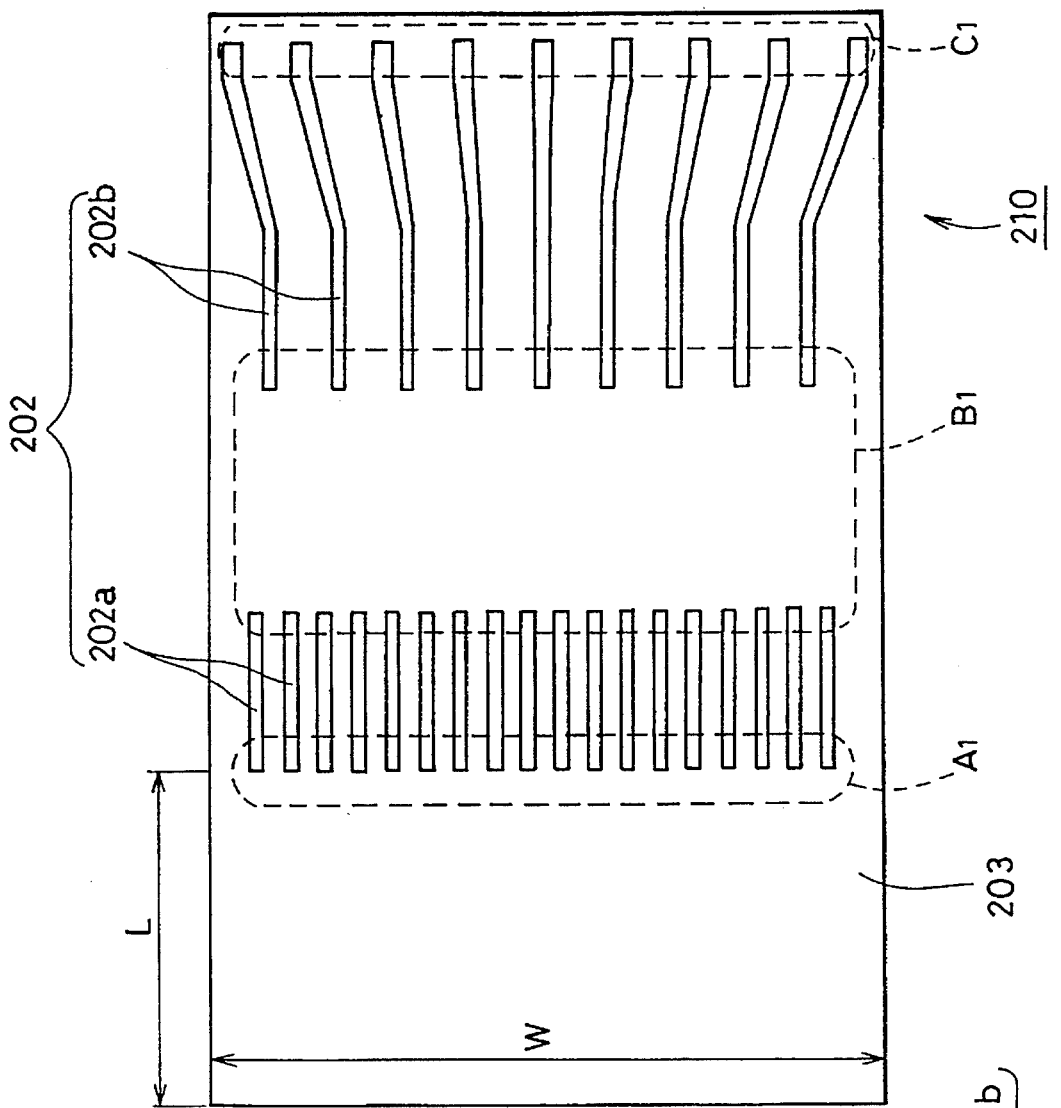
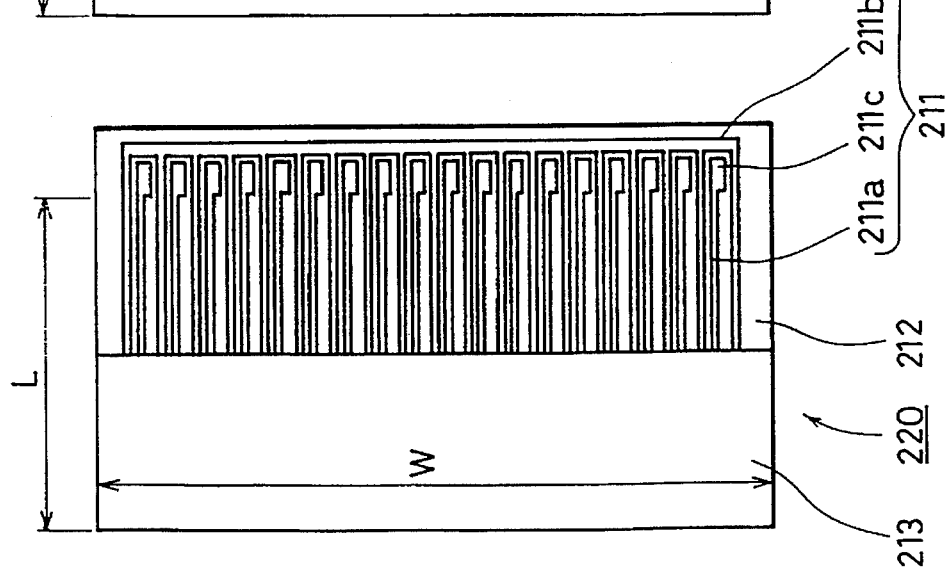
FIG. 20(a)
FIG. 20(b)

THIN FILM MAGNETIC HEAD STRUCTURE AND METHOD OF FABRICATING THE SAME FOR ACCURATELY LOCATING AND CONNECTING TERMINALS TO TERMINAL CONNECTIONS

This application is a continuation of application Ser. No. 07/894,593 filed on Jun. 5, 1992, now abandoned.

BACKGROUND OF THE INVENTION

1. Field of the Invention

The present invention relates to a thin film magnetic head structure and a method of fabricating the same, and more particularly, it relates to a thin film magnetic head structure which is characterized in its terminal connection structure, and a method of fabricating the same.

2. Description of the Background Art

In relation to a magnetic recording apparatus which has recently been increased in capacity and decreased in size, a magnetic head is desired having high recording density and a multi-track function. In order to increase the number of tracks, it is necessary to reduce widths of the respective tracks, as well as those of terminals provided in the magnetic head. Thus, spaces between adjacent terminals are reduced and a terminal extracting portion must be increased in connection accuracy.

A description is now made on connection in a terminal extraction portion of a conventional thin film magnetic head structure.

FIG. 26 is a plan view showing terminal connection in a conventional thin film magnetic head structure, and FIG. 27 is a sectional view taken along the line IV—IV in FIG. 26.

Referring to FIGS. 26 and 27, the conventional thin film magnetic head structure includes a flexible printed board 510, a thin film magnetic head portion 520 and a support plate 530. The flexible printed board 510 is formed by a number of lead terminals 502, a base film 503 and a cover film 504. The lead terminals 502 are arranged on the surface of the base film 503, which is made of polyimide. The lead terminals 502 are formed of copper foil members and Au layers which are formed on the copper foil members by plating. The cover film 504 is so bonded onto the surfaces of the lead terminals 502 as to partially expose the lead terminals 502.

The thin film magnetic head portion 520 is formed by external connection terminals 511, a magnetic substrate 512, an element portion 513 and a protective plate 514. The element portion 513 is formed on a surface of the magnetic substrate 512, which is close to a medium sliding surface 519 for sliding movement of a magnetic medium such as a tape. The external connection terminals 511c are electrically connected with the element portion 513, to extend on the surface of the magnetic substrate 512 toward the other end. Two such external connection terminals 511a and 511b are extracted from each element, so that the first terminal 511a, serving as an externally connected terminal, is provided with a wide externally extracted pattern 511c on its forward end, while the other terminal 511b is grounded. The protective plate 514, which is made of ferrite, glass or the like, is bonded onto the surface of the element portion 513. The medium sliding surface 519, which is defined by the magnetic substrate 512, the element portion 513 and the protective plate 514, has arbitrary curvature.

The base film 503 of the flexible printed board 510 and the magnetic substrate 512 of the thin film magnetic head portion 520 are bonded onto the support plate 530. In such a bonding step, the flexible printed board 510 and the thin film magnetic head portion 520 must be located on the support plate 530 at a high accuracy, in order to oppose the lead terminals 502 and the external connection terminals 511 to be connected with each other. The lead terminals 502 are electrically connected with the corresponding external connection terminals 511 through wires 501, which are made of Au, Al or the like, by a terminal connection method utilizing a wire bonding technique. In more specific terms, the wires 501 are compression-bonded to the terminals 502 and 511, with the application of ultrasonic vibration.

The conventional thin film magnetic head structure is formed in the aforementioned manner.

A method of fabricating the conventional thin film magnetic head structure is now described.

First, a number of groups of lead terminals for forming flexible printed boards are formed on a sheet-type film. Then, the sheet-type film is punched out to form a number of flexible printed boards including film parts and the lead terminals. Each of the flexible printed boards is located on and bonded to a support plate with a thin film magnetic head portion. Then, the lead terminals are electrically connected with external connection terminals provided on the thin film magnetic head portion by wire bonding. Thereafter the lead terminals, the external connection terminals, wires and the like are sealed by molding.

The conventional thin film magnetic head structure is fabricated in the aforementioned manner.

In the aforementioned conventional thin film magnetic head structure, the lead terminals 502 are electrically connected with the corresponding external connection terminals 511 by the wires 501. In this case, both ends of the wires 501 must be employed for connecting the terminals with each other. Thus, complicated wire bonding operations are disadvantageously required in a number of portions.

In order to automate the wire bonding step, on the other hand, it is necessary to bond the flexible printed board 510 and the thin film magnetic head portion 520 onto the support plate 530 in advance. Further, bonding must be done after the flexible printed board 510 and the thin film magnetic head portion 520 are located highly precisely.

When the flexible printed board 510 is bonded onto the support plate 530, bubbles may enter the bonded portion, to disadvantageously absorb ultrasonic waves in the wire bonding step. In this case, it is difficult to sufficiently bond the wires 501 with the lead terminals 502 since the ultrasonic waves are not transferred to the lead terminals 502. Thus, bondability between the wires 501 and the lead terminals 502 is reduced.

Further, the wire bonding step requires a temperature of about 150° C., which may soften a binder for bonding the lead terminals 502 to the base film 503. When the binder is thus softened, the ultrasonic waves are absorbed by the base film 503 in the wire bonding step. Thus, the ultrasonic waves are so insufficiently transferred to the lead terminals 502 that bondability is reduced between the wires 501 and the lead terminals 502. Therefore, the wire bonding step must be carried out under a relatively low temperature with difficulty in selection of bonding conditions, leading to extremely small and unstable margins for such condition setting.

In addition, the flexible printed board 510 forming the thin film magnetic head structure is bonded onto the support plate 530 after the same is punched out from a sheet-type film. Thus, the step of bonding each flexible printed board 510 onto the support plate 530 is so extremely complicated that it is difficult to automate the fabrication steps.

SUMMARY OF THE INVENTION

An object of the present invention is to remove the necessity for an accurate location of terminals with respect to terminal connection in a thin film magnetic head structure.

Another object of the present invention is to attain high reliability in electrical connection for terminal connection in a thin film magnetic head structure.

Still another object of the present invention is to simplify a bonding step in a method of fabricating a thin film magnetic head structure.

A further object of the present invention is to attain improvement in workability to a large extent in a method of fabricating a thin film magnetic head structure.

A further object of the present invention is to automate fabrication steps in a method of fabricating a thin film magnetic head structure.

In order to attain the aforementioned objects, the inventive thin film magnetic head structure comprises a thin film magnetic head substrate, connection terminals, lead terminals, a terminal formation substrate, and a conductive layer. The thin film magnetic head substrate has a major surface, and includes a thin film magnetic head. The connection terminals are so arranged on the major surface of the thin film magnetic head substrate as to extend from an element portion included in the thin film magnetic head. A plurality of lead terminals are arranged in correspondence to respective ones of the connection terminals. The terminal formation substrate holds the respective lead terminals to expose at least a surface being opposite to the connection terminals. The conductive layer is formed on the surfaces of either the connection terminals or the lead terminals, to be interposed between the terminals which are opposite to each other.

According to the inventive thin film magnetic head structure for the embodiments of the present invention, the surfaces of the lead terminals are opposed to those of the corresponding connection terminals through the conductive layer. Therefore, it is possible to directly bond the terminal formation substrate to the thin film magnetic head substrate so that the former is supported by the latter, whereby no specific support plate is required for supporting these substrates. Thus, no two-stage location is required for the thin film magnetic head substrate and the terminal formation substrate in relation to such a support plate. In other words, the terminal formation substrate may simply be located on the thin film formation substrate. Consequently, no accurate location is required and it is possible to simplify the bonding step.

Since no wire bonding technique is employed, no insufficient bonding is caused by absorption of ultrasonic waves or the like, whereby reliability of electrical connection is improved.

Further, it is possible to simultaneously connect the opposite surfaces of the terminals with each other by pressurization or the like. Thus, no connection is required in a number of portions dissimilarly to wire bonding, whereby workability can be improved to a large extent.

According to an embodiment of the present invention, the lead terminals preferably include first portions which are held in the terminal formation substrate, and second portions which extend from the first portions to protrude from the terminal formation substrate so that at least the surfaces thereof are exposed.

The terminal formation substrate preferably has a surface which is opposite to the major surface of the thin film magnetic head substrate, so that the lead terminals are formed on this surface.

Further, the terminal formation substrate is preferably formed by a film.

In addition, the terminal formation substrate preferably includes a protective portion covering the element portion.

In a thin film magnetic head structure according to an aspect of the present invention, the terminal formation substrate includes a protective plate covering the element portion, so that the element portion is protected by the terminal formation substrate to require no specific protective plate.

Preferably the conductive layer includes a barrier metal layer, a plating layer which is formed on the surface of the barrier metal layer, and a gold layer which is formed on the surface of the plating layer.

Alternatively, the conductive layer is preferably formed of a gold layer.

The terminal formation substrate preferably includes a first terminal formation substrate which is provided with first lead terminals to be connected with the connection terminals, and a second terminal formation substrate which is provided with second lead terminals to be connected with the first lead terminals.

In order to attain the aforementioned objects in the inventive method of fabricating a thin film magnetic head structure for an embodiment of the present invention, prepared is a terminal formation substrate holding a plurality of lead terminals to have at least exposed portions. Prepared is a thin film magnetic head substrate including a thin film magnetic head having a major surface which is provided with a plurality of connection terminals to extend from an element portion included in the thin film magnetic head. A conductive layer is formed on either the exposed portions of the lead terminals or the connection terminals. The terminal formation substrate and the thin film magnetic head substrate are so arranged as to oppose the lead terminals and the connection terminals to each other. Then the exposed portions of the lead terminals are connected to the connection terminals through the conductive layer.

Preferably the step of forming the conductive layer includes a step of forming a barrier metal layer on the surfaces of either the exposed portions of the lead terminals or the connection terminals, a step of forming a plating layer on the surface of the barrier metal layer, and a step of forming a gold layer on the surface of the plating layer.

In order to attain the aforementioned objects in another aspect of the inventive method of fabricating a thin film magnetic head structure, prepared is a tape which is provided along a prescribed direction with a plurality of terminal formation substrates each holding a plurality of lead terminals to have at least exposed portions. Prepared are magnetic head substrates each including a thin film magnetic head and having a major surface provided with a plurality of connection terminals to extend from an element portion included in the thin film magnetic head. A conductive layer is formed on either the exposed portions of the lead terminals or the connection terminals. The magnetic head substrates are arranged on the tape to oppose the lead terminals and the connection terminals to each other. The exposed portions of the lead terminals are connected with the connection terminals through the conductive layer. Then the terminal formation substrates are separated from the tape.

According to this method of fabricating a thin film magnetic head structure, a number of terminal formation substrates are arranged on the tape to be located on and bonded to the thin film magnetic head substrates. Thus, it is possible to continuously bond the terminal formation substrates being arranged on the tape to the thin film magnetic head substrates by moving the tape. Therefore, the fabrication steps can be automated as compared with a case of bonding such terminal formation substrates one by one onto thin film magnetic head substrates. Further, it is possible to improve workability to a large extent.

In addition, the substrates can be bonded, resin-molded and subjected to evaluation of electrical properties by employing such a tape to tape processing method. Thus, it is possible to easily automate fabrication of such thin film magnetic head structures, as well as to reduce the steps by about tens of percent, thereby extremely reducing the cost.

The inventive method preferably includes a step of arranging the respective thin film magnetic substrates along alignment marks which are formed on the tape in correspondence to the terminal formation substrates.

Further, the step of preparing the tape preferably includes a step of preparing the tape so that a plurality of terminal formation substrates are formed from a portion of the tape.

In addition, a plurality of terminal formation substrates are preferably arranged/formed on the tape in a line along the longitudinal direction of the tape.

Alternatively, a plurality of terminal formation substrates are arranged/formed on the tape in a plurality of lines along the longitudinal direction of the tape.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 20(a) and 20(b) are plan views showing a thin film magnetic head portion and a lead substrate portion forming a thin film magnetic head structure according to a third embodiment of the present invention;

DESCRIPTION OF THE PREFERRED EMBODIMENTS

Figure 1:
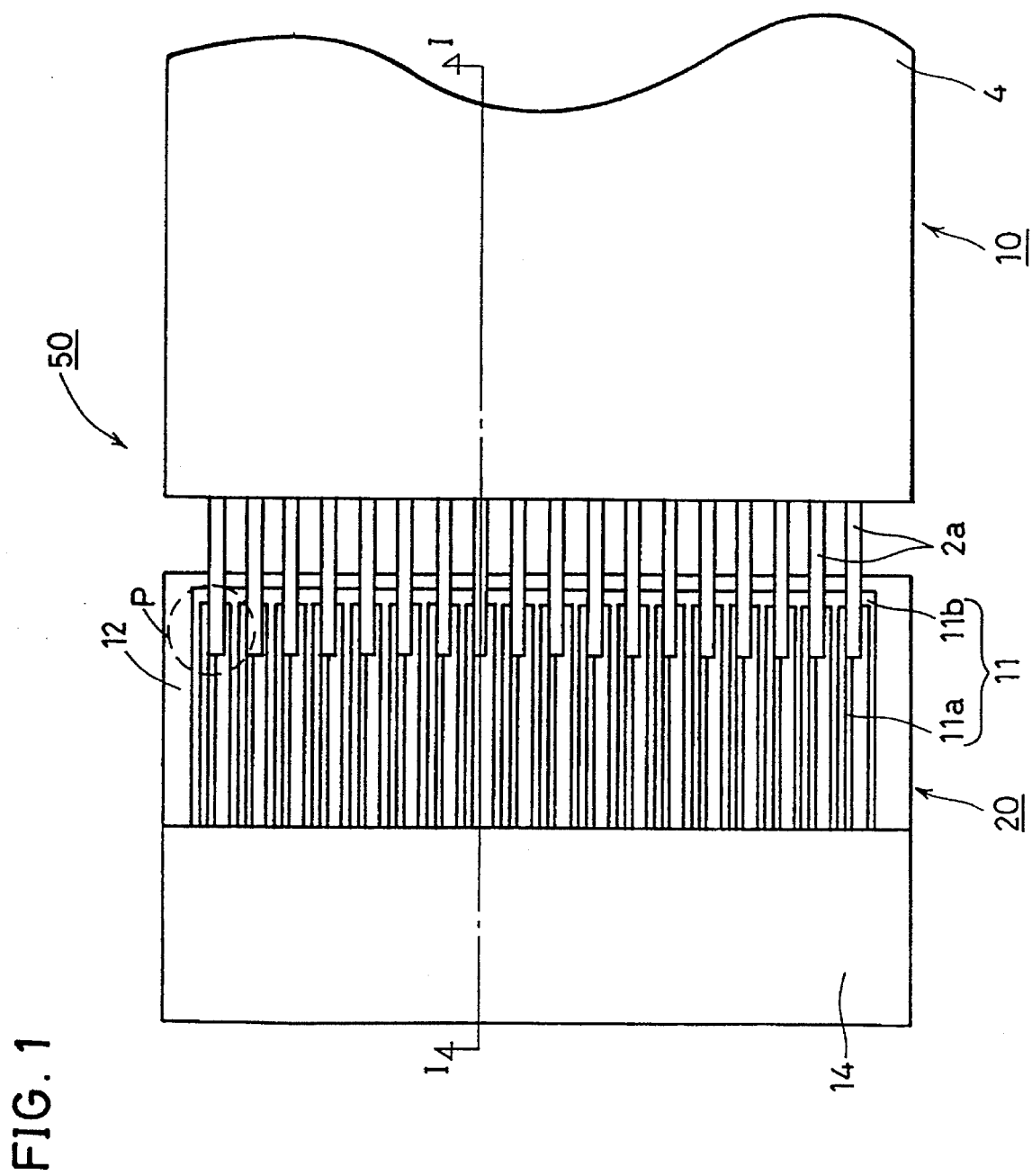
FIG. 1 is a plan view schematically illustrating a thin film magnetic head structure according to a first embodiment of the present invention.
Figure 2:
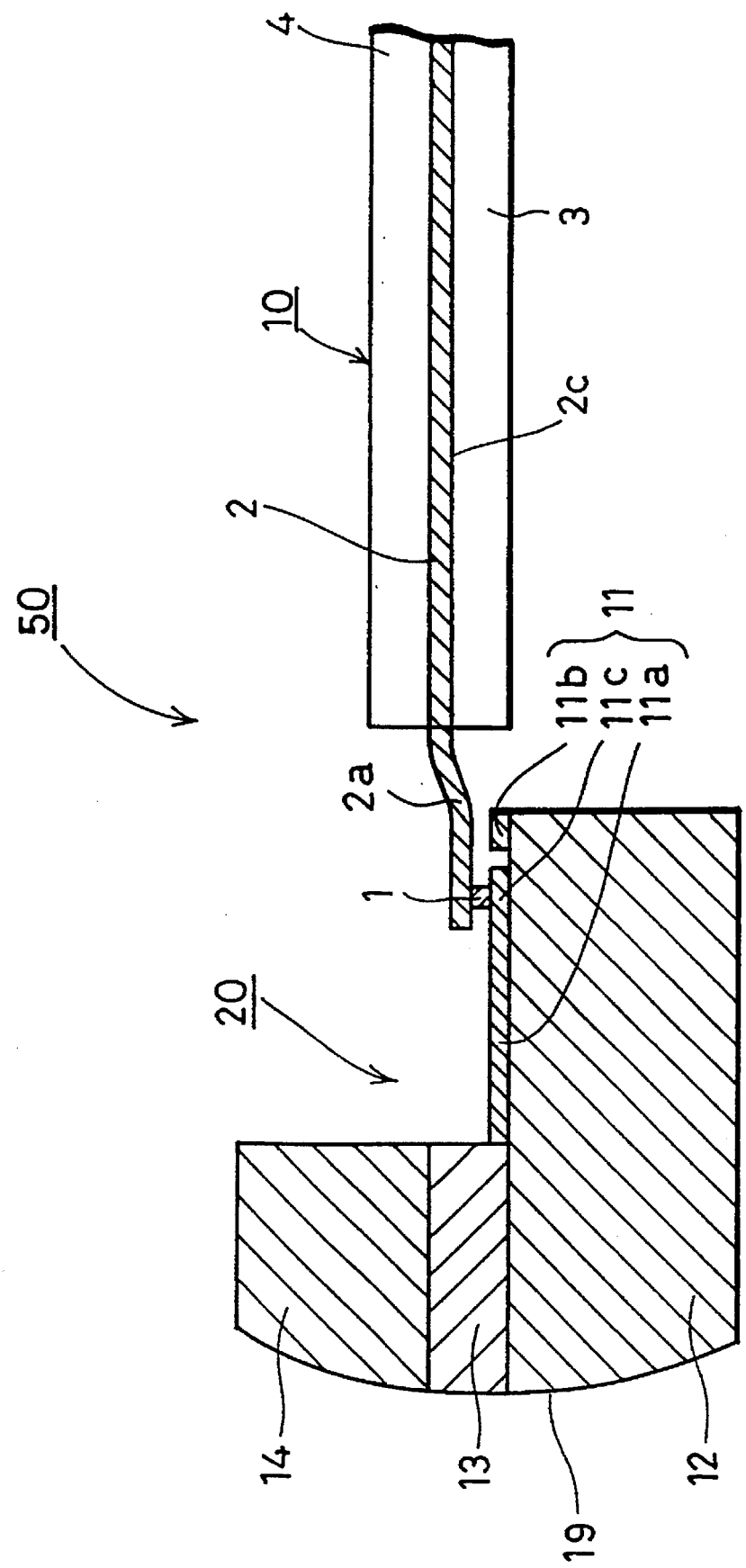
FIG. 2 is a sectional view taken along the line I—I in FIG. 1.

Referring to FIGS. 1 and 2, a thin film magnetic head structure 50 according to a first embodiment of the present invention includes a flexible printed board 10 and a thin film magnetic head portion 20.

The thin film magnetic head portion 20 is formed by external connection terminals 11, a magnetic substrate 12 of ferrite or the like, an element portion 13, and a protective plate 14. The element portion 13 is formed on a surface of the magnetic substrate 12, which is close to a medium sliding surface 19. The external connection terminals 11 are formed on the surface of the magnetic substrate 12, to extend from the element portion 13 toward the other end. These external connection terminals 11 include externally connected terminals 11a and grounded terminals 11b. Such external connection terminals 11 are made of aluminum (Al) or the like in thicknesses of about 3000Å, i.e., the minimum value required for attaining sufficient tensile strength in junction interfaces between the same and Au after bonding. It has been confirmed that reliable connection between the externally connected terminals 11a and Au can be attained equivalently to an IC chip with this film thickness. Au bumps (see FIG. 3(b)) are formed on forward ends of the externally connected terminals 11a through a barrier metal film of a Ti-W alloy and a plating substrate film (not shown) of Au. Namely, a conductive layer 1 including the Au bumps is formed over the forward ends of the externally connected terminals 11a. The Au bumps are about 20 to 30 μm in thickness. The protective plate 14 of ferrite, glass, ceramic or the like is bonded onto the surface of the element portion 13. The magnetic substrate 12, the element portion 13 and the protective plate 14 define the medium sliding surface 19, which is worked in prescribed curvature to allow sliding movement of a magnetic medium such as a tape.

The flexible printed board 10 is formed by a base film 3, lead terminals 2 and a cover member 4. A number of lead terminals 2, which are made of copper foil, are arranged/formed on the surface of the base film 3. The cover member 4 formed of solder resist or the like is bonded to cover the surfaces of the lead terminals 2, so that the surfaces are partially exposed from the base film 3 and the cover member 4. The exposed portions of the lead terminals 2 are entirely plated with Au layers, to define inner lead terminals 2a. The lead terminals 2 include such inner lead terminals 2a, portions 2c held by the base film 3 and the cover member 4, and outer lead terminals (not shown).

The inner lead terminals 2a are arranged/formed with the same pitches as the Au bumps included in the conductive layer 1 which are formed on the externally connected terminals 11a, so that the same are bonded to and electrically connected with the corresponding ones of the Au bumps. The inner lead terminals 2a are bonded to the Au bumps through the same material of Au, due to the Au layers plated thereon. Thus, the connected portions are improved in reliability.

The thin film magnetic head structure according to the first embodiment of the present invention is formed in the aforementioned manner.

The structure of the conductive layer 1 including the Au bumps is now described in detail.

Referring to FIGS. 3(a) and 3(b), the externally connected terminals 11a are provided on forward ends thereof with wide externally extracted pattern portions 11c. A surface protective film 15 of an oxide ($SiO_2$) is formed on the surface of the magnetic substrate 12 which is provided with the external connection terminals 11, to cover the same. This surface protective film 15 is provided with holes 15a, to partially expose the externally extracted pattern portions 11c from the same. A barrier metal film 16 of a Ti-W alloy is formed to cover such exposed portions of the externally extracted pattern portions 11c, thereby serving as a diffusion preventing film. A plating substrate film 17 of Au is deposited on the surface of the barrier metal film 16, so that the Au bumps 1a are formed on its surface in thicknesses of about 20 to 30 μm. Thus, the conductive layer 1 is formed by the Au bumps 1a, the barrier metal film 16 and the plating substrate film 17.

A method of fabricating the conductive layer is now described.

Figure 4:
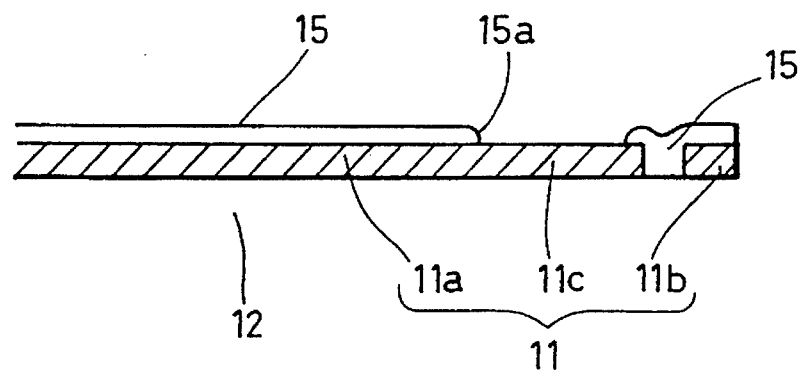
FIGS. 4 to 8 are sectional views successively showing steps in a method of fabricating the conductive layer according to an embodiment of the present invention.

Referring to FIG. 4, the surface protective film ($SiO_2$) 15 is formed on the surface of the magnetic substrate 12, to cover the external connection terminals 11. The holes 15a are formed in this surface protective film 15 by patterning, so that the externally extracted pattern portions 11c are partially exposed from the holes 15a.

Figure 5:
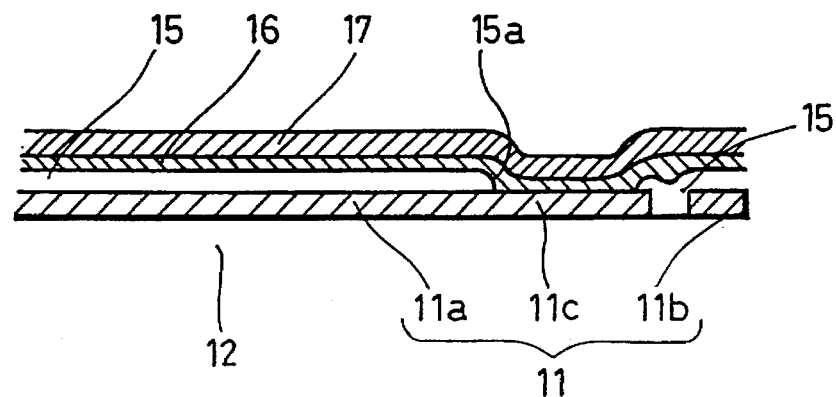

Referring to FIG. 5, the barrier metal film 16 of a Ti-W alloy is vapor-deposited over the entire surface of the magnetic substrate 12, and the plating substrate film 17 of Au is vapor-deposited over the entire surface of the barrier metal film 16.

Figure 6:
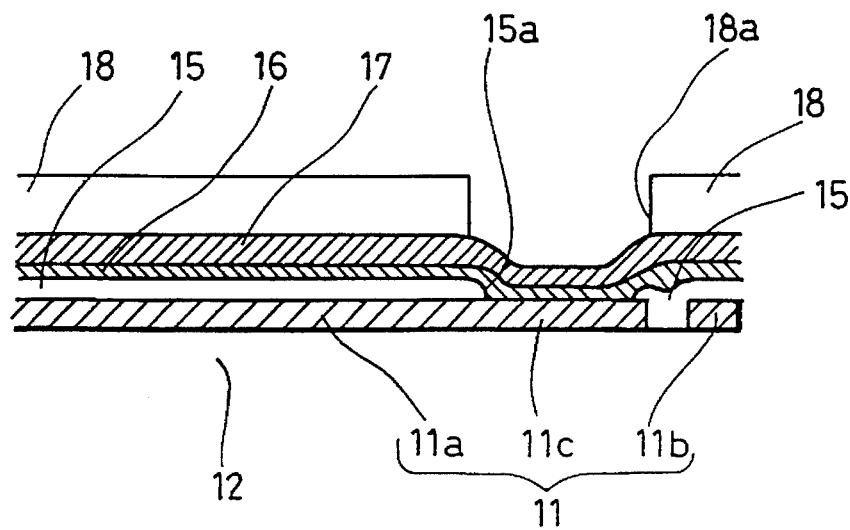

Referring to FIG. 6, a photoresist film 18 is applied onto the surface of the plating substrate film 17. Then, holes 18a are formed in the photoresist film 18 by sensitizing or the like in portions above the externally extracted pattern portions 11c of the lead terminals 11, to partially expose the plating substrate film 17.

Figure 7:
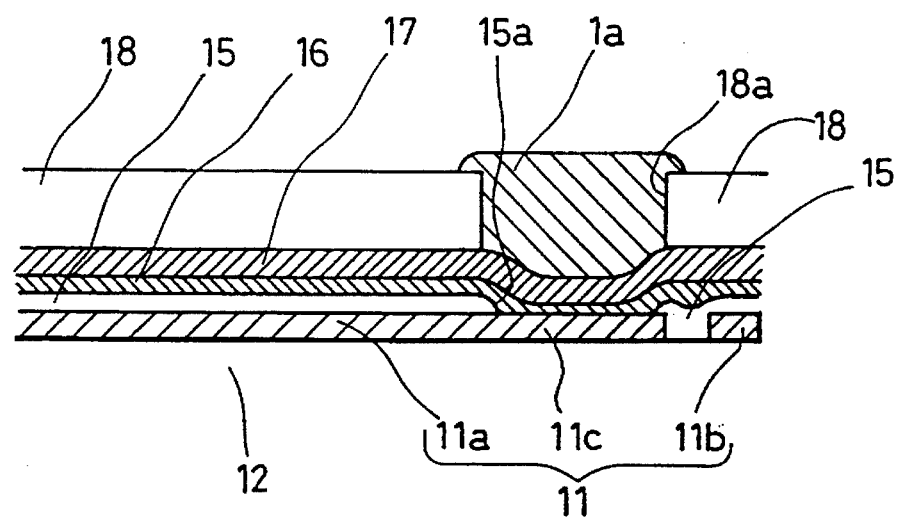

Referring to FIG. 7, the Au bumps 1a are formed by electrolytic plating, to fill up the holes 18a. The Au bumps 1a are electrically connected with the externally extracted pattern portions 11c through the barrier metal film 16 and the plating substrate film 17.

Figure 8:
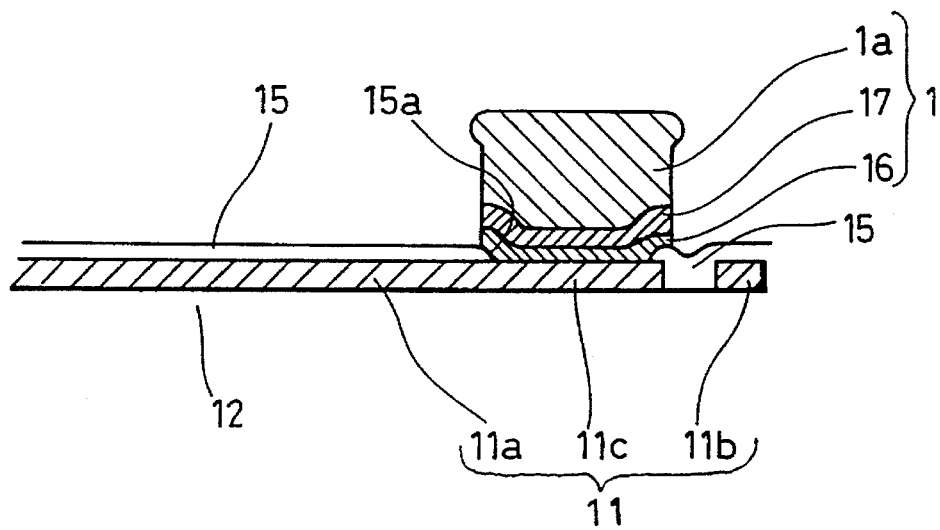

Referring to FIG. 8, the photoresist film 18 is removed, while parts of the barrier metal film 16 and the plating substrate film 17 are also removed by using the Au bump 1a as a mask, except for those provided on the externally extracted pattern portions 11c.

The conductive layer 1 is formed in the aforementioned manner.

A method of fabricating the thin film magnetic head structure according to the first embodiment of the present invention is now described with reference to FIGS. 9 to 14.

Figure 9:
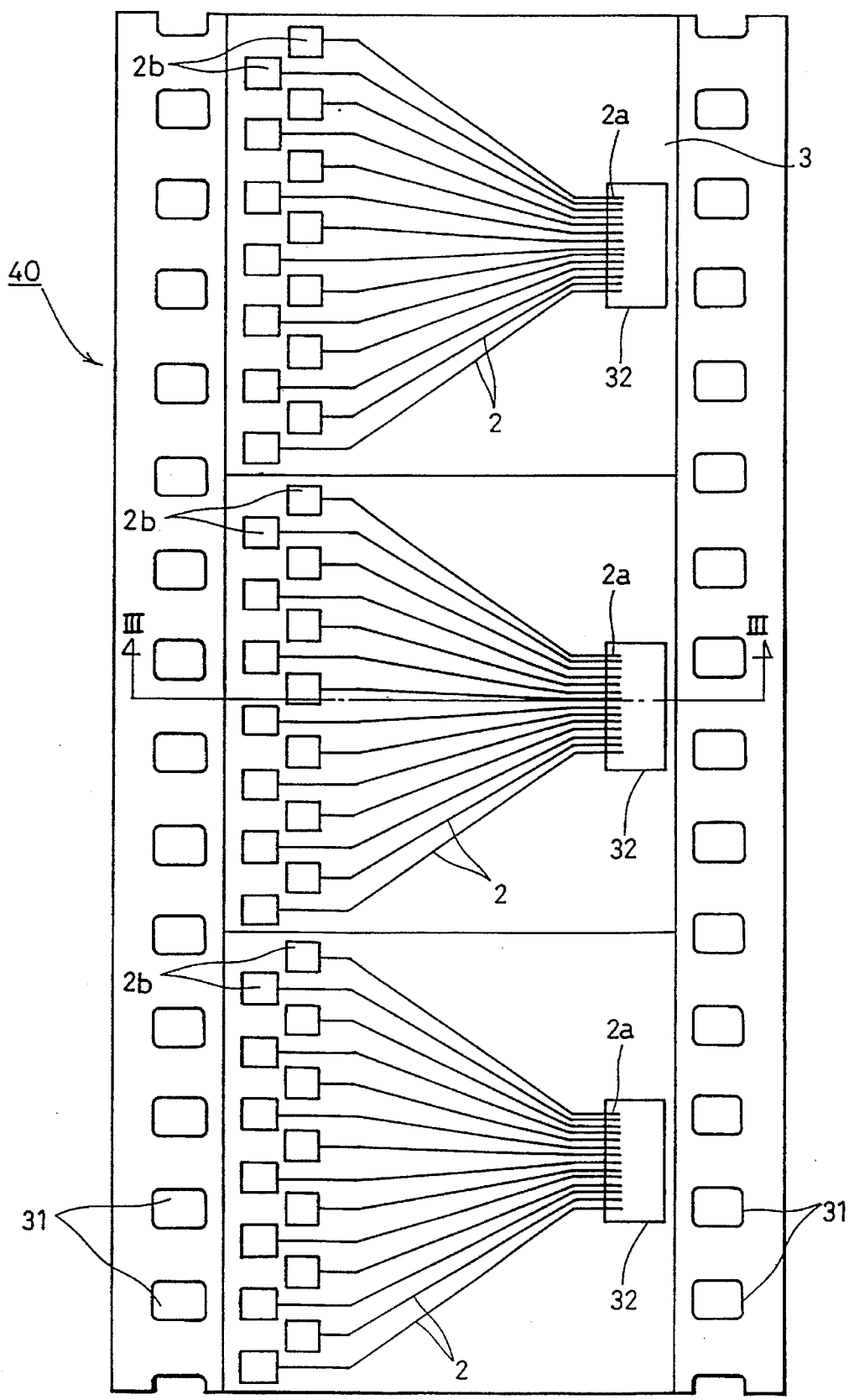
FIG. 9 is a plan view schematically illustrating the structure of a first carrier tape which is employed for fabricating the thin film magnetic head structure according to the first embodiment of the present invention.

Referring to FIG. 9, the carrier tape 40 is formed by a film 3, a cover member and a plurality of groups of lead terminals 2. A plurality of sprocket holes 31 are formed on each end of the film 3 with constant pitches. Further, holes 32 are formed in relatively inward portions of the film 3 at regular intervals, so that the forward ends of the lead terminals 2, which are provided on and bonded to the film 3, project from the holes 32. Such forward ends of the lead terminals 2 projecting from the holes 32 define inner lead terminals 2a, while the other ends define outer lead terminals 2b. The cover member is formed to cover the lead terminals 2. Such lead terminals 2 are arranged along the longitudinal direction of the film 3, so that each group of the lead terminals 2 forms a single flexible printed board. The carrier tape 40 having the aforementioned structure is 35 mm or 70 mm in width. The sprocket holes 31 of this carrier tape 40 are engaged with sprocket wheels (not shown). With such a carrier tape 40, each thin film magnetic head structure is formed in the following manner.

Figure 10:
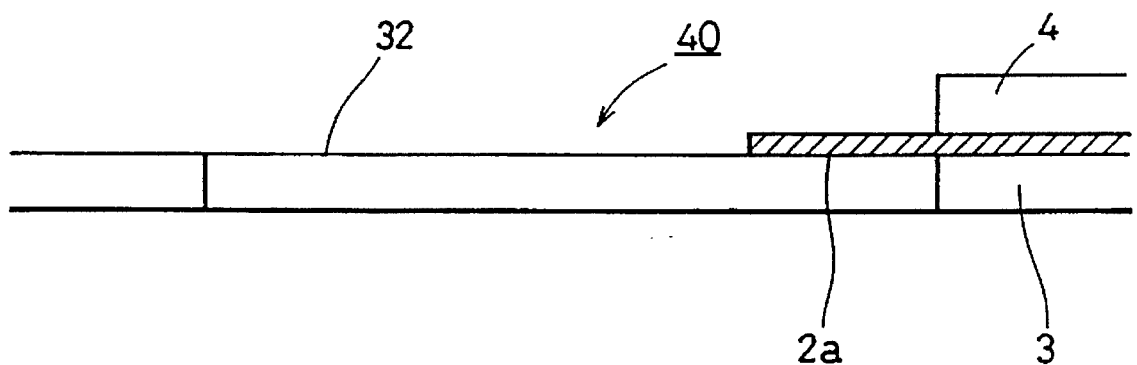
FIGS. 10 to 12 are enlarged sectional views taken along the line III—III in FIG. 9, schematically illustrating steps in the method of fabricating the thin film magnetic head structure according to the first embodiment of the present invention.

Referring to FIG. 10, the carrier tape 40 is fed by the sprocket wheels (not shown) at constant pitches. Then a CCD camera (not shown) detects arbitrary points of the inner lead terminals 2a exposed through the film 3 and the cover member 4. Consequently, the positions thereof are confirmed.

Figure 11:
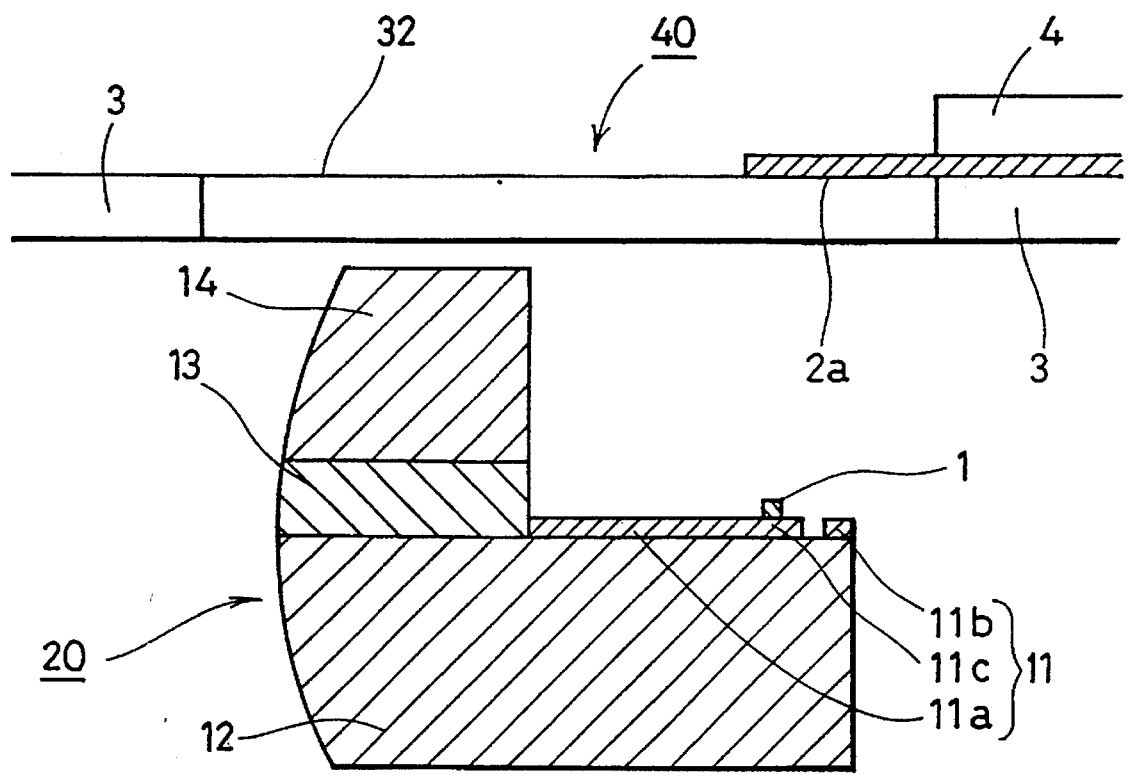

Referring to FIG. 11, the CCD camera also detects arbitrary points of the external connection terminals 11 simultaneously with the positional confirmation of the inner lead terminals 2a, thereby correcting relative positions of the arbitrary points of the inner lead terminals 2a and the external connection terminals 11 as to directions X, Y and θ. Thus, the inner lead terminals 2a are aligned with the externally extracted pattern portions 11c.

Figure 12:
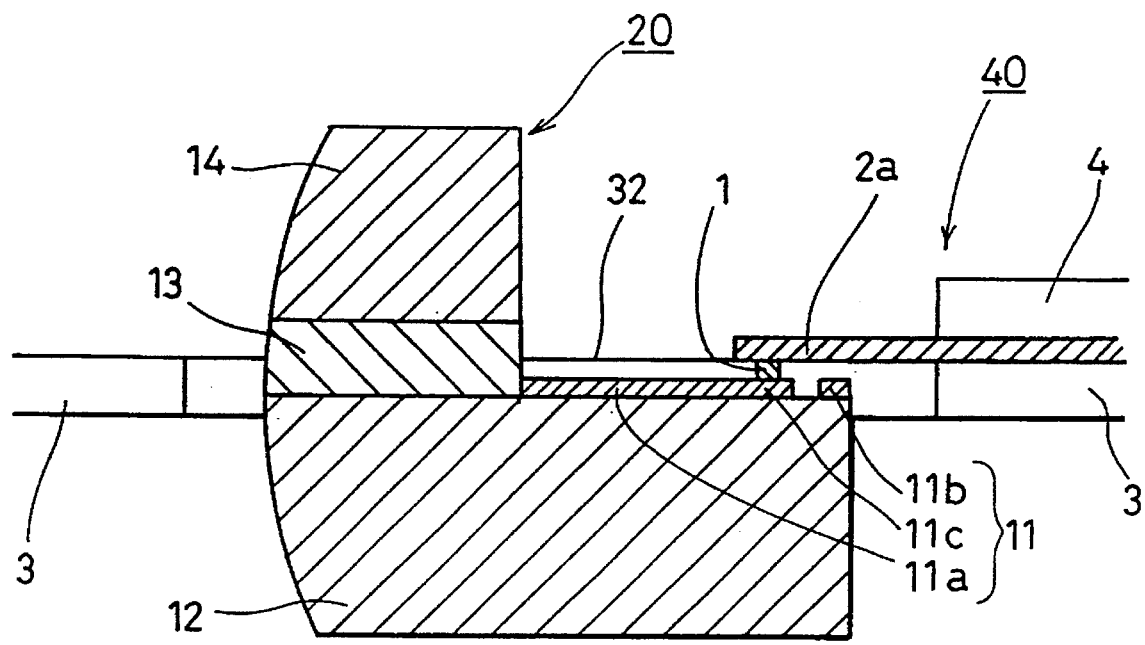

Referring to FIG. 12, the inner lead terminals 2a are bonded to the conductive layer 1, covering the externally extracted pattern portions 11c, under pressure by a tool, at a tool temperature of about 500° C. and a stage temperature of about 150° C. with a load of about 40 to 60 g/lead for about 1 to 2 seconds. After the inner lead terminals 2a are bonded to the externally extricated pattern portions 11c, the carrier tape 40 is molded with sealing resin. Thereafter both electrical and magnetic properties of the carrier tape 40 are tested by a prober, utilizing the outer lead terminals.

Figure 13:
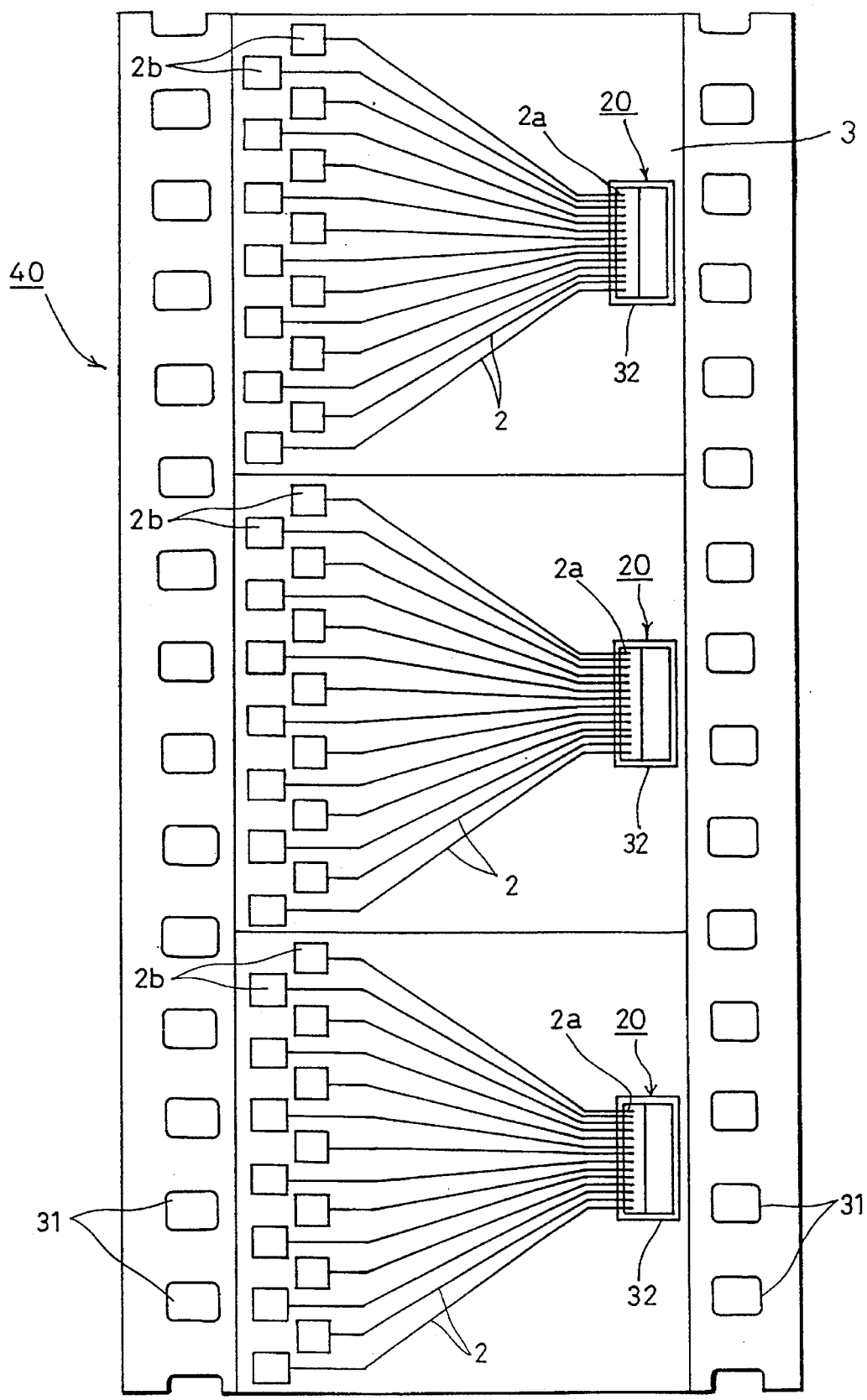
FIG. 13 is a plan view showing the first carrier tape employed for the thin film magnetic head structure according to the first embodiment of the present invention, on which thin film magnetic head portions are mounted.
Figure 14:
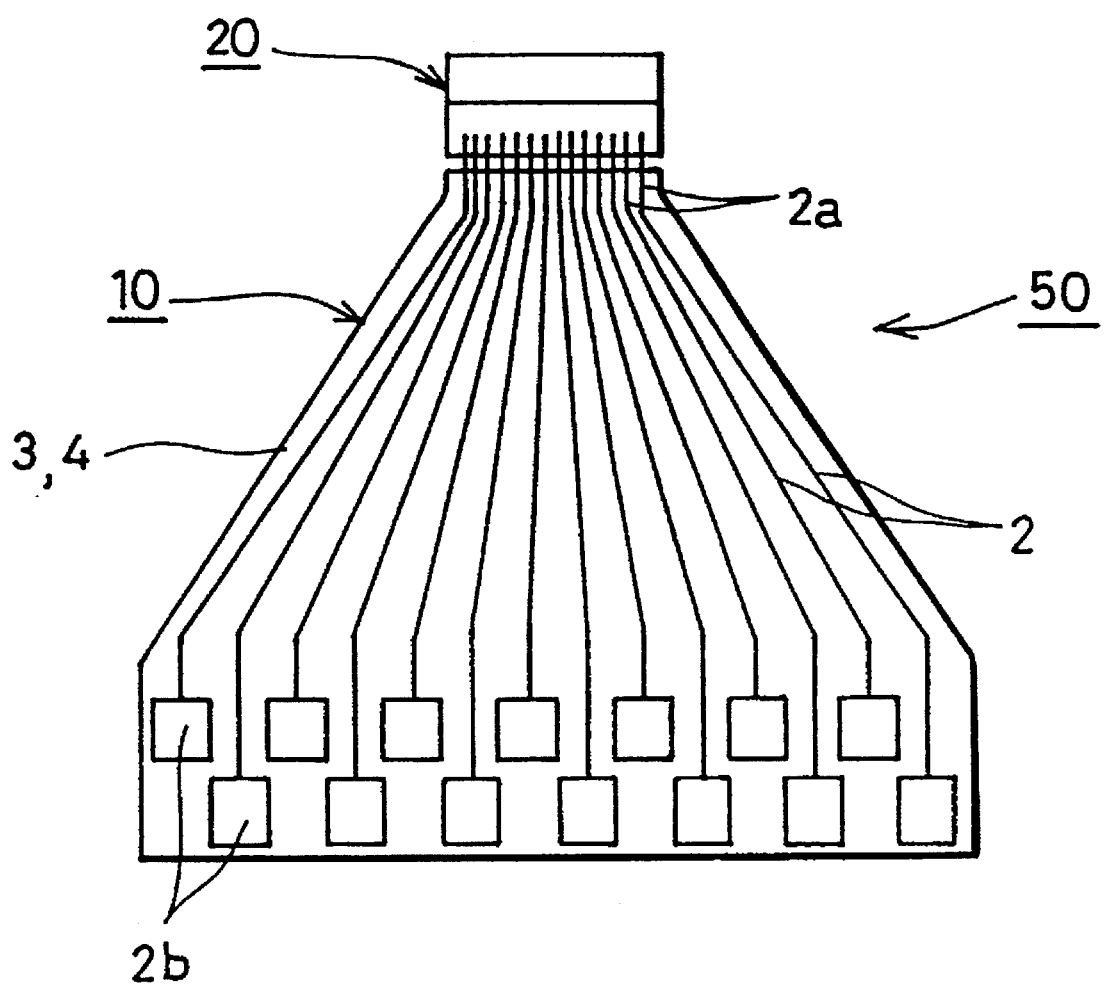
FIG. 14 is a plan view schematically showing the thin film magnetic head structure according to the first embodiment of the present invention.

FIG. 13 shows the as-formed thin film magnetic head portions 20, which are arranged on the carrier tape 40. Each flexible printed board is punched out from the carrier tape 40, which is thus provided with the thin film magnetic head portions 20 as shown in FIG. 13. FIG. 14 shows a thin film magnetic head structure 50, which is formed by such a flexible printed board 10 and the thin film magnetic head portion 20.

The thin film magnetic head structure according to the first embodiment of the present invention is fabricated in the aforementioned manner.

Figure 15:
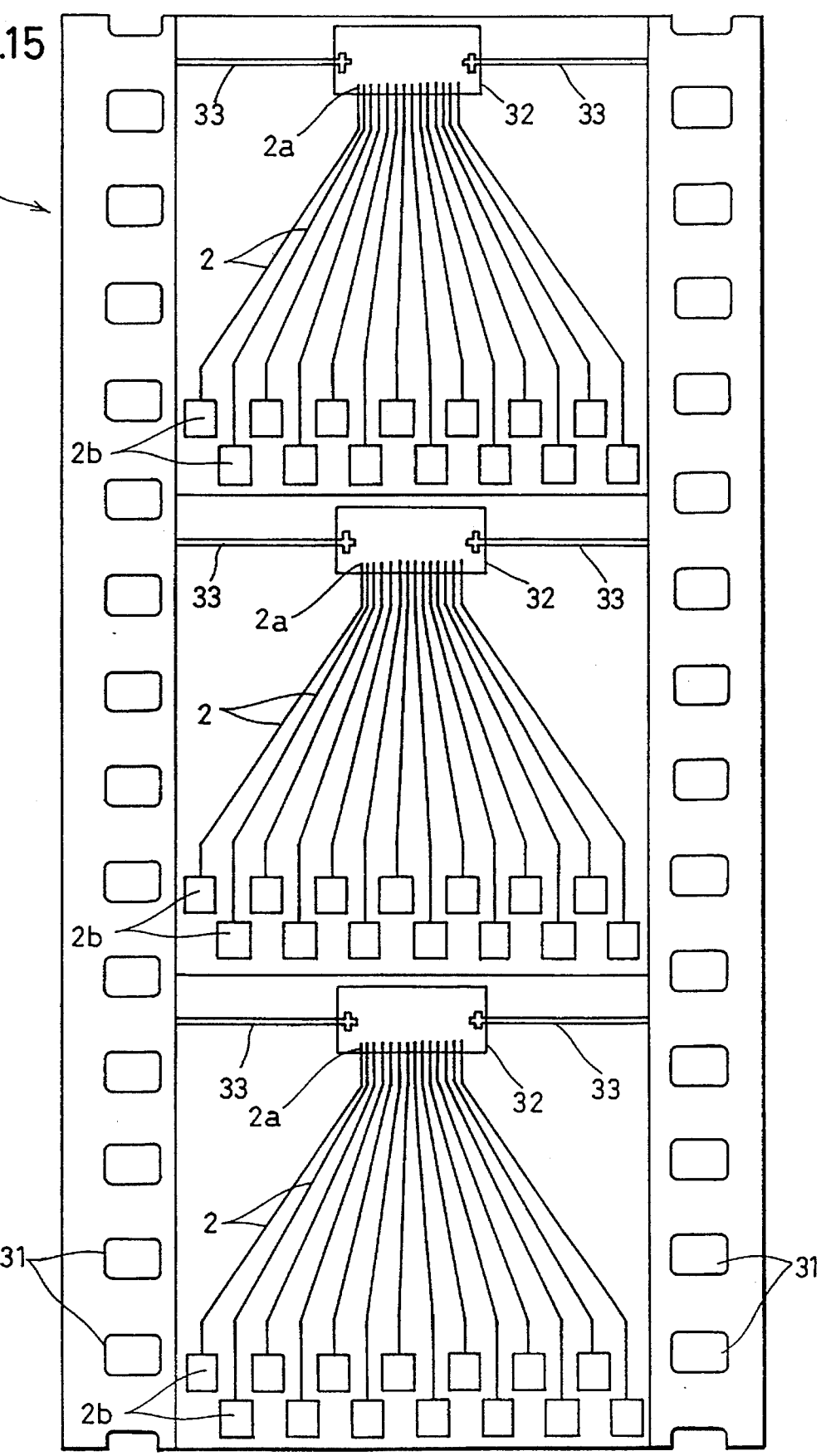
FIG. 15 is a plan view schematically showing the structure of a second carrier tape employed for fabricating the thin film magnetic head structure according to the first embodiment of the present invention.

The carrier tape employed for fabricating the thin film magnetic head structure according to the first embodiment of the present invention is not restricted to that shown in FIG. 9. Alternatively, such a carrier tape may be provided with alignment marks 33, as shown in FIG. 15. It is possible to work such alignment marks 33 into alignable forms through the material for lead terminals 2. Due to arrangement of such alignment marks 33, it is possible to easily align the terminals to be bonded to each other for forming thin film magnetic head portions.

Figure 16:
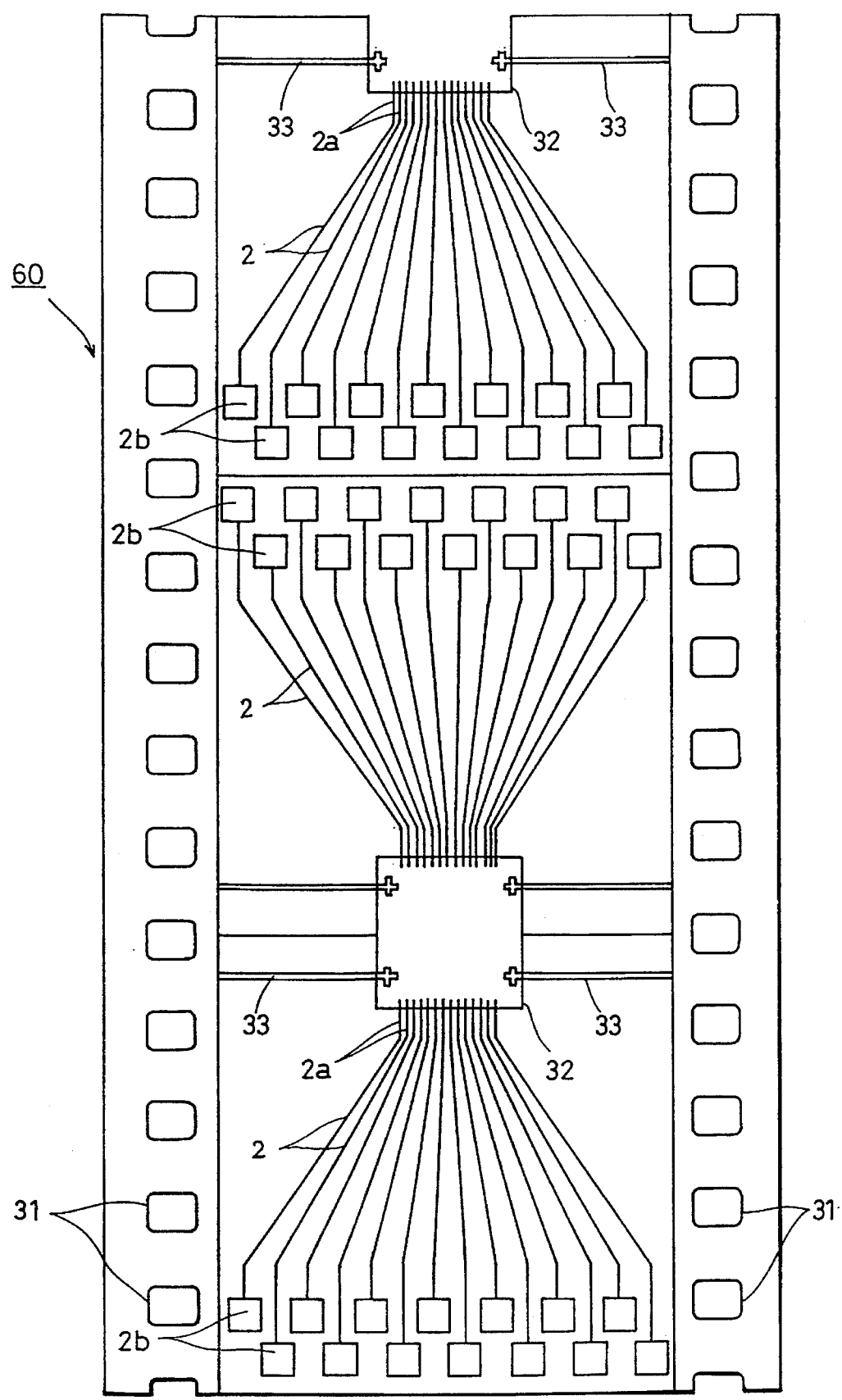
FIG. 16 is a plan view schematically showing the structure of a third carrier tape employed for fabricating the thin film magnetic head structure according to the first embodiment of the present invention.
Figure 17:
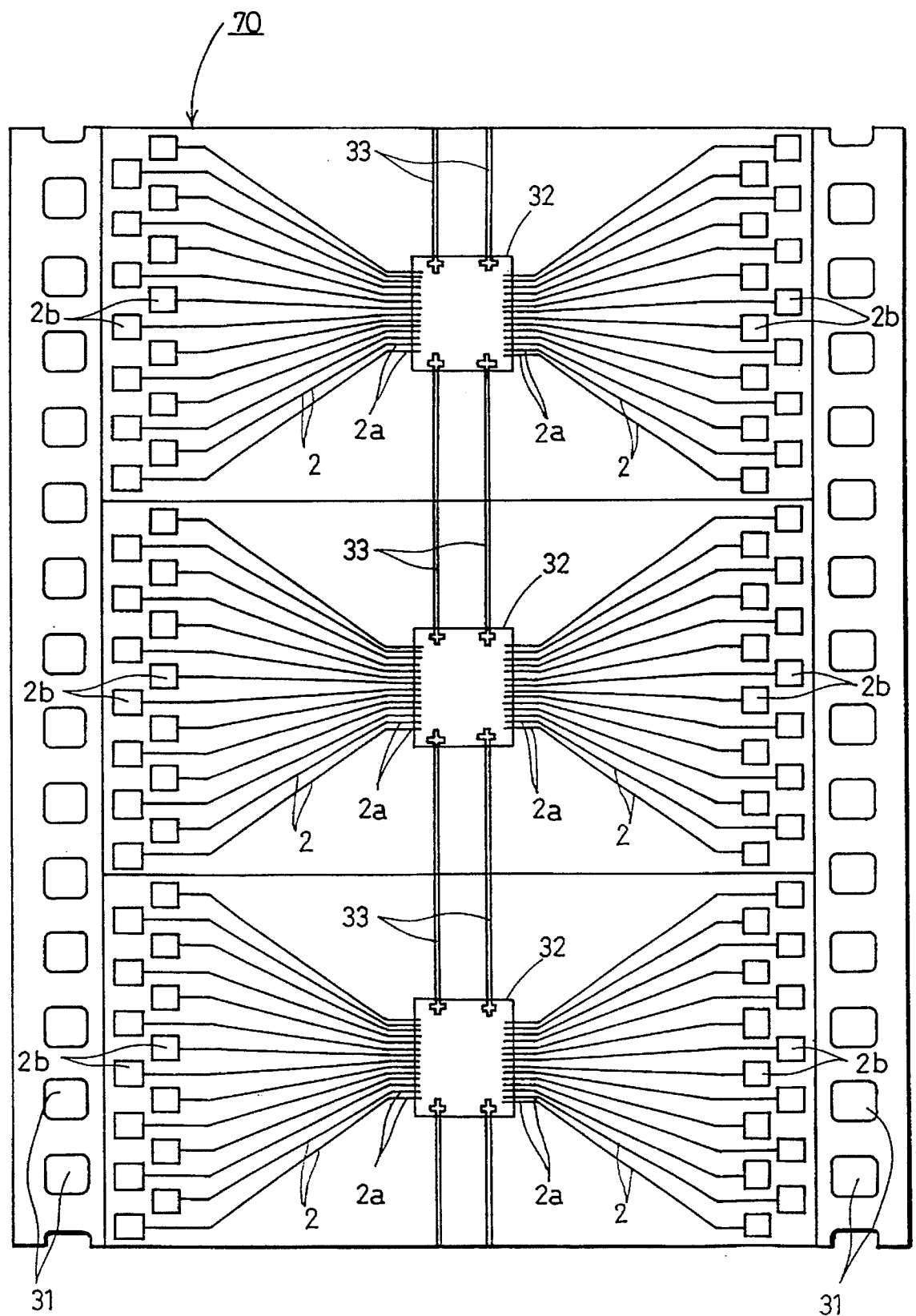
FIG. 17 is a plan view schematically showing the structure of a fourth carrier tape employed for fabricating the thin film magnetic head structure according to the first embodiment of the present invention.

The groups of lead terminals for forming flexible printed boards may not necessarily be arranged as shown in FIGS. 9 and 15, but may freely be arranged as shown in FIGS. 16 and 17.

The alignment marks 33 shown in FIGS. 15, 16 and 17 are not requisite for the present invention.

A thin film magnetic head structure according to a second embodiment of the present invention is now described.

Figure 18A:
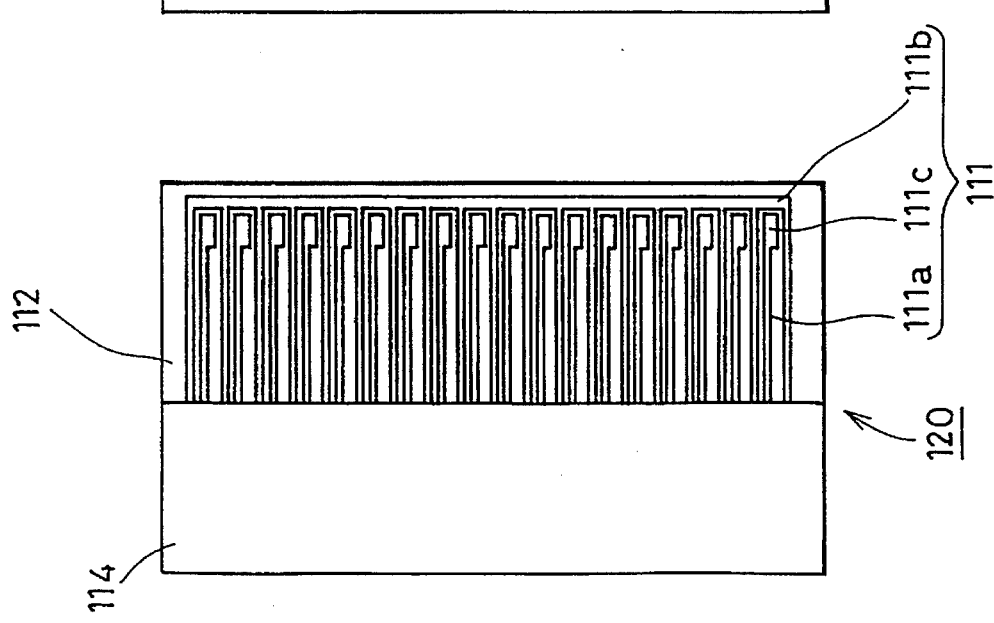
FIGS. 18(a) and 18(b) are plan views showing a thin film magnetic head portion and a lead substrate portion forming a thin film magnetic head structure according to a second embodiment of the present invention respectively.
Figure 18B:
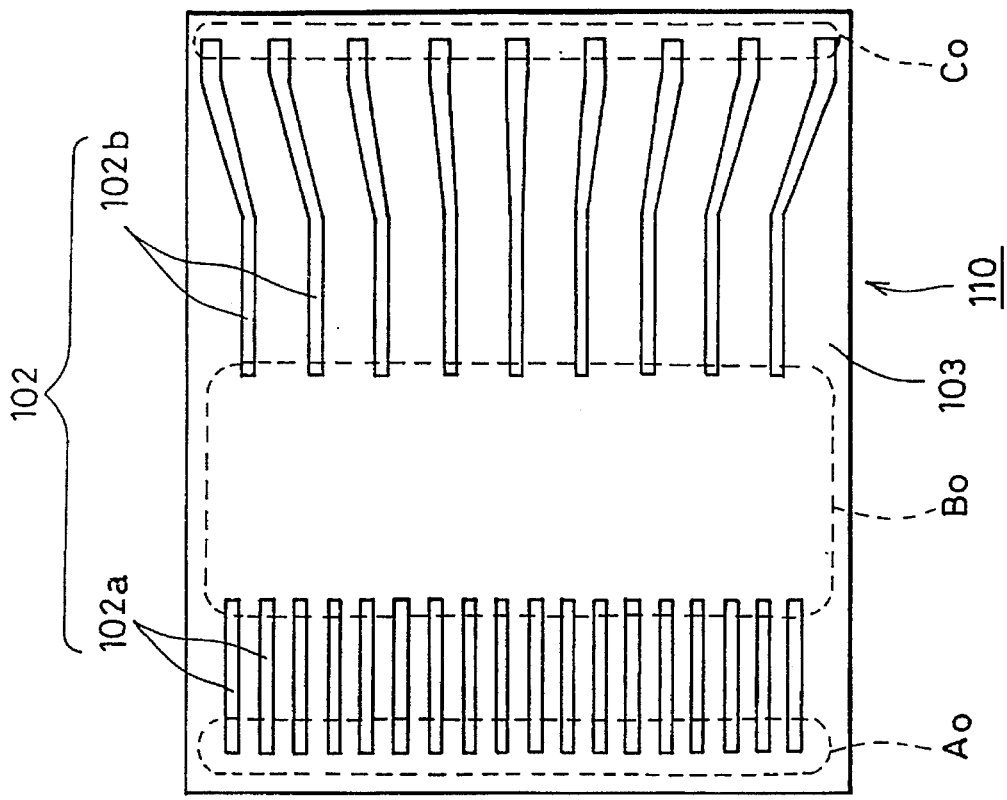
Figure 19:
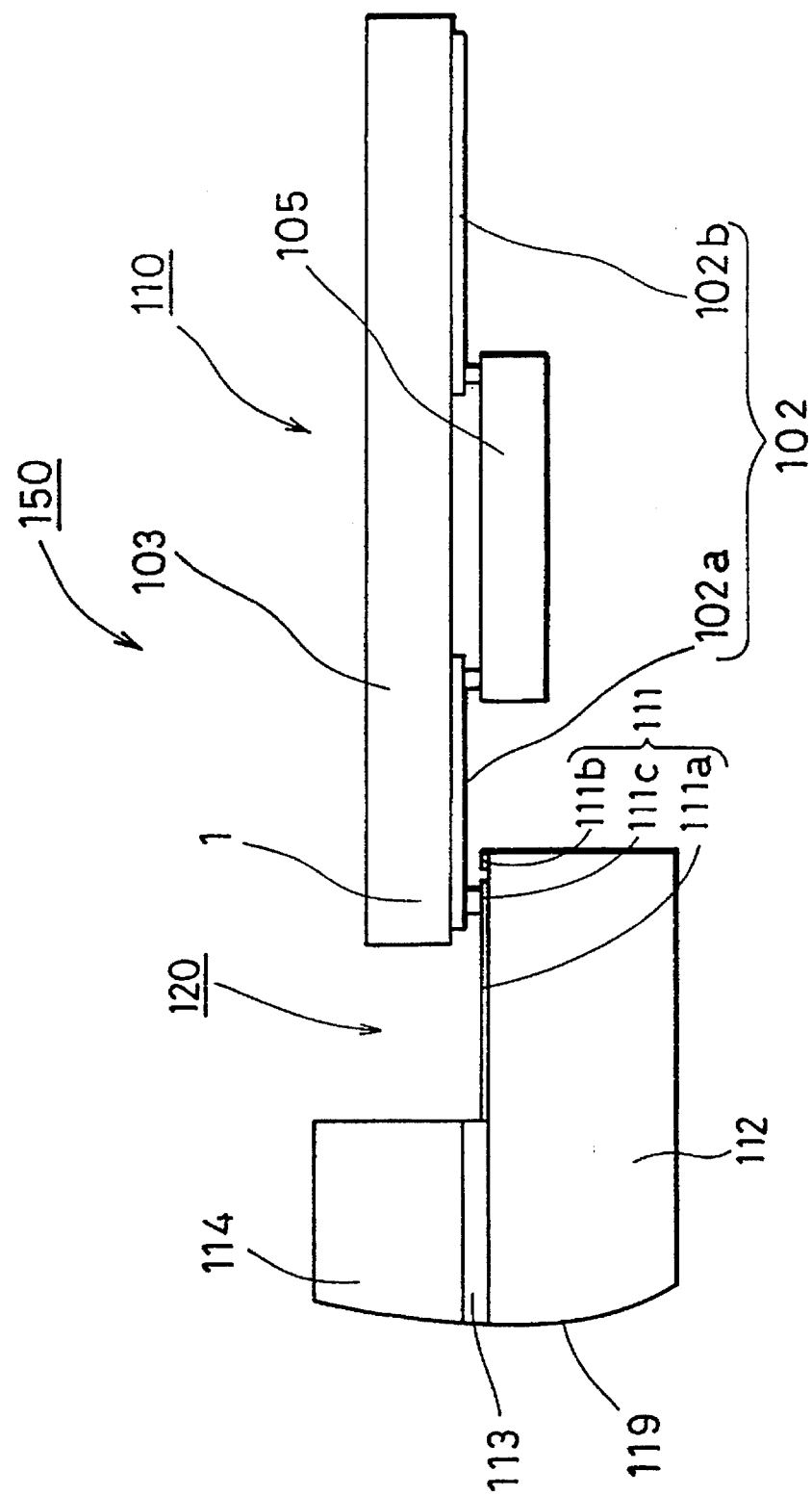
FIG. 19 is a side elevational view schematically illustrating the thin film magnetic head structure according to the second embodiment of the present invention.

Referring to FIGS. 18 and 19, a thin film magnetic head structure 150 includes a thin film magnetic head portion 120 and a lead substrate portion 110.

Figure 3:
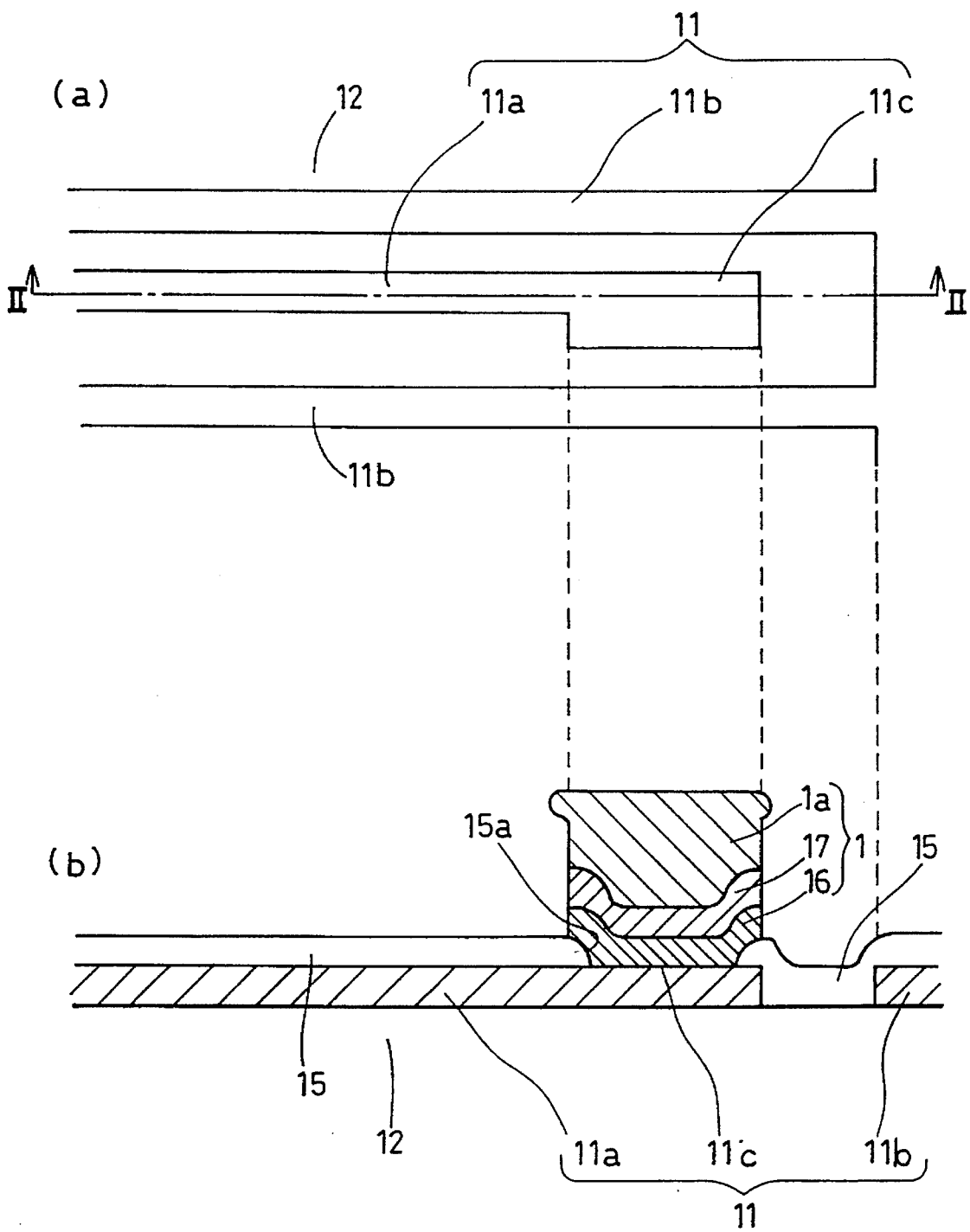
FIG. 3 is a plan view schematically illustrating the structure of a thin film magnetic head portion in a part P shown in FIG. 1, and part (b) is a sectional view taken along the line II—II in part (a)

The thin film magnetic head portion 120 is formed by a magnetic substrate 112 of ferrite or the like, an element portion 113, external connection terminals 111, a conductive layer 1, a protective plate 114, and the like. The element portion 113 is formed on a surface of the magnetic substrate 112, which is close to a medium sliding surface 119. The external connection terminals 111 of Al or the like are formed on the surface of the magnetic substrate 112, to extend from the element portion 113. The external connection terminals 111 include externally connected terminals 111a and grounded terminals 111b. The externally connected terminals 111a are provided on forward ends thereof with wide externally extracted pattern portions 111c. The external connection terminals 111 are formed, for example, of aluminum (Al). The protective plate 114 is bonded onto the surface of the element portion 113, to cover the same. The magnetic substrate 112, the element portion 113 and the protective plate 114 define the magnetic sliding surface 119, which has constant curvature. The conductive layer 1 is formed over the externally extracted pattern portions 111c. As shown in FIG. 3, this conductive layer 1 is formed by a barrier metal film 16, a plating substrate film 17, and Au bumps 1a.

The lead substrate portion 110 is formed by a glass substrate 103 and a plurality of lead terminals 102 which are formed on the surface of the glass substrate 103. The lead terminals 102 include a plurality of lead terminals 102a extending from a region $A_0$ to another region $B_0$, and a plurality of lead terminals 102b extending from the region $B_0$ to still another region $C_0$. The lead terminals 102a are formed with the same pitches as the externally extracted pattern portions 111c, while the lead terminals 102b have larger pitches than the lead terminals 102a in the region $B_0$. The lead terminals 102b are arranged with larger pitches in the region $C_0$ than those in the region $B_0$. The pitches of these terminals are adapted to be the same as the externally extracted pattern portions (not shown) of a driver IC 105 which is actually mounted. Such lead terminals 102a and 102b are formed by patterning a lead layer, which is vacuum-deposited over the entire surface of the glass substrate 103. The driver IC 105 is mounted on the region $B_0$, to be electrically connected with the lead terminals 102a and 102b.

The lead terminals 102a formed on the surface of the lead substrate portion 110 are electrically connected with corresponding ones of the externally extracted pattern portions 111c respectively through the conductive layer 1. In order to attain such connection, the surface of the glass substrate 103 provided with the lead terminals 102 is opposed to the surface of the magnetic substrate 112 provided with the external connection terminals 111.

A method of bonding the lead substrate portion 110 to the thin film magnetic head portion 120 is now described.

Referring to FIGS. 18 and 19, the lead terminals 102a are aligned with the external connection terminals 111, in order to bond the lead substrate portion 110 to the thin film magnetic head portion 120. First, a CCD camera (not shown) detects arbitrary points of the lead terminals 102a, thereby confirming the position of the lead substrate portion 110. The CCD camera also detects arbitrary points of the external connection terminals 111, thereby correcting relative positions of the arbitrary points of the lead terminals 102a and the external connection terminals 11 as to directions X, Y and θ. Thereafter the surfaces of the lead substrate portion 110 and the thin film magnetic head portion 120 provided with the terminals 102 and 111 are opposed to each other and brought into pressure contact with each other by a tool. The bonded portions of the lead substrate portion 110 and the thin film magnetic head portion 120 are filled up with resin such as photo-hardened resin or epoxy resin, which in turn is hardened by ultraviolet radiation or heat. Thus, the thin film magnetic head structure 150 according to the second embodiment of the present invention is obtained.

It is possible to simultaneously bond the driver IC 105 to the lead terminals 102a and 102b of the lead substrate portion 110 through a step similar to the above step. The thin film magnetic head structure 150 can be bonded to an external substrate or the like through the region $C_0$ of the lead substrate portion 110 sufficiently by soldering or the like, since only a small number of lead terminals 102b are connected in the region $C_0$ with relatively large pitches.

A thin film magnetic head structure according to a third embodiment of the present invention is now described.

Figure 21:
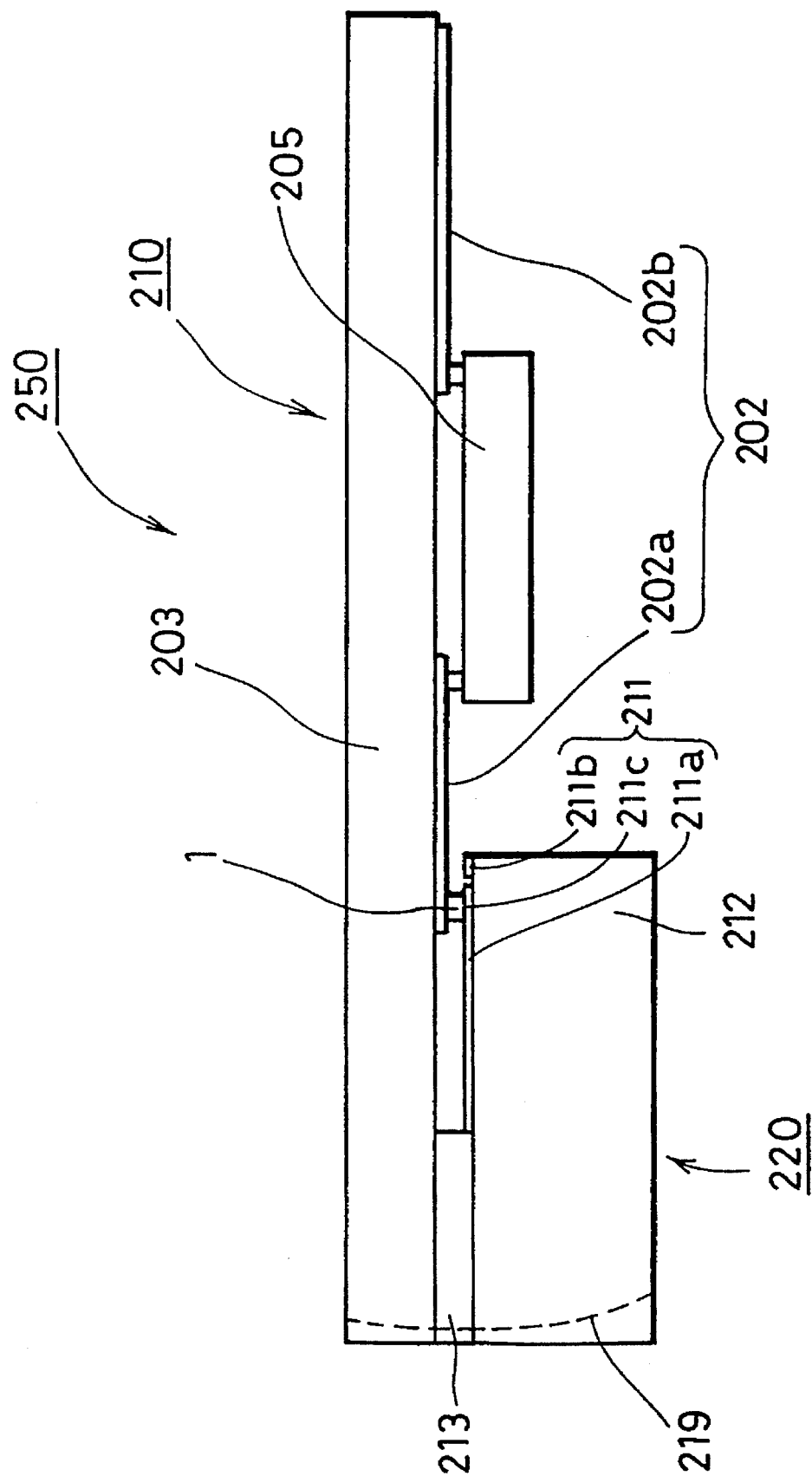
FIG. 21 is a side elevational view schematically illustrating the thin film magnetic head structure according to the third embodiment of the present invention.

Referring to FIGS. 20 and 21, a thin film magnetic head structure 250 includes a thin film magnetic head portion 220 and a lead substrate portion 210.

The thin film magnetic head portion 220 is formed by a magnetic substrate 212, an element portion 213, external connection terminals 211, a conductive layer 1, and the like. The thin film magnetic head portion 220 is substantially similar in structure to that (150) shown in FIGS. 18 and 19 of the second embodiment, except for that no protective plate is mounted on the surface of the element portion 213. The distance between an end which is close to a medium sliding surface and externally extracted pattern portions 211c is set at L, while the width of the thin film magnetic head portion 220 is set at W.

The lead substrate portion 210 is formed by a glass substrate 203 and lead terminals 202a and 202b. This lead substrate portion 210 is substantially similar in structure to that shown in FIGS. 18 and 19 of the second embodiment. The distance between forward ends of the lead terminals 202a which are formed on the surface of the glass substrate 203 and the forward end of the glass substrate 203 is set at L, while the width of the glass substrate 203 is set at W. A driver IC 205 is mounted on a region $B_1$, to be electrically connected with the lead terminals 202a and 202b, while another region $C_1$ is employed for connection with an external substrate.

The lead terminals 202a are electrically connected with corresponding ones of the externally extracted pattern portions 211c through the conductive layer 1 respectively. In order to attain such connection, the surface of the glass substrate 203 provided with the terminals 202a and 202b is opposed to the surface of the magnetic substrate 212 provided with the external connection terminals 211. A region of the lead substrate portion 210, which is adjacent to a region $A_1$ with the space L, is adapted to cover the element portion 213 of the thin film magnetic head portion 220. An end defined by the glass substrate 203, the element portion 213 and the magnetic substrate 212 are worked into a medium sliding surface 219 having desired curvature.

A method of bonding the lead substrate portion 210 to the thin film magnetic head portion 220 is now described.

Referring to FIGS. 20 and 21, the distance L and the width W are set in both of the lead substrate portion 210 and the thin film magnetic head portion 220. In order to bond these portions to each other, therefore, the surfaces provided with the terminals may be simply opposed to each other and brought into contact with each other under pressure, while the end surfaces for defining the medium sliding surface 219 are aligned with each other. The relative positions of the lead terminals 202a and the conductive layer 1 which is formed over the externally extracted pattern portions 211c are accurately set by such bonding. Then the bonded portions of the lead substrate portion 210 and the thin film magnetic head portion 220 are filled up with resin such as photo-hardened resin or epoxy resin, which in turn is hardened by ultraviolet radiation or heat.

After the lead substrate portion 210 is bonded to the thin film magnetic head portion 220, the end surface defined by the magnetic substrate 212, the element portion 213 and the glass substrate 203 are worked into the medium sliding surface 219 having prescribed curvature, as shown by a dotted curve in FIG. 21.

The driver IC 205 is bonded to the lead substrate portion 210 in a similar manner to that shown in FIGS. 18 and 19. Namely, a CCD camera (not shown) corrects relative positions of the driver IC 205 and the lead terminals 20a and 202b, so that the driver IC 205 is mounted on the glass substrate 203 under pressure to be electrically connected with the lead terminals 202a and 202b.

Particularly in the thin film magnetic head structure 250 according to the third embodiment of the present invention, the lead substrate portion 210 protects the surface of the element portion 210. In other words, the glass substrate 203 also serves as a protective plate, whereby no specific protective plate is required and a step of bonding the same can be omitted.

In the thin film magnetic head structures 50 (FIG. 2), 150 (FIG. 19) and 250 (FIG. 21) according to the first, second and third embodiments of the present invention, the conductive layers 1 are in the structure shown in FIG. 3. However, such a conductive layer 1 employed in the first, second and third embodiments (FIG. 2, FIG. 19, FIG. 21) is not restricted to the structure shown in FIG. 3, but may be formed by only Au bumps. A method of fabricating a conductive layer 1 formed by only Au bumps is now described, referring to the first embodiment as an example.

Figure 22:
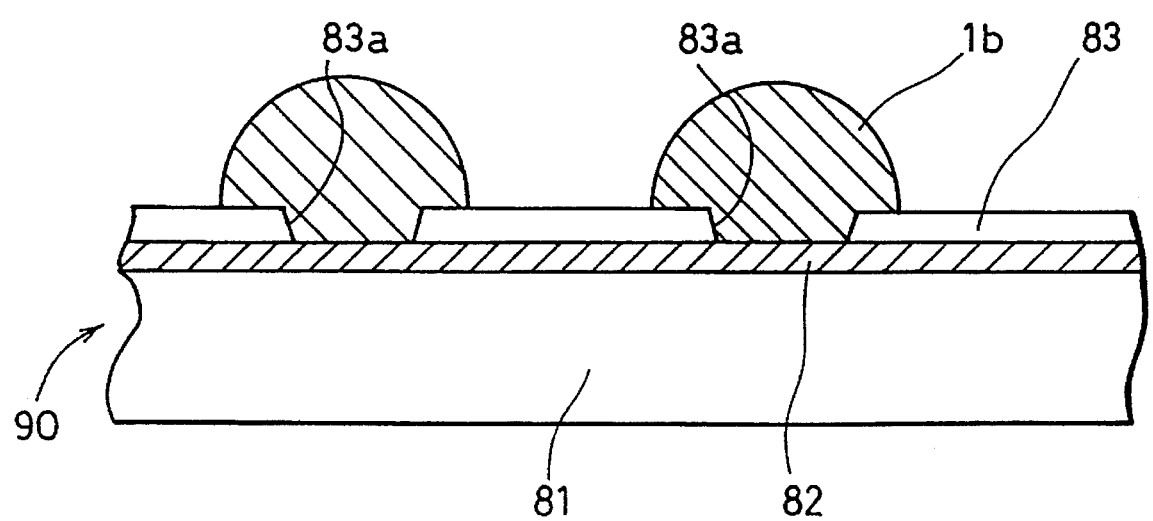
FIG. 22 is a sectional view schematically showing a base material for illustrating another method of fabricating the conductive layer according to an embodiment of the present invention.

Referring to FIG. 22, a base material 90 is prepared independently of a flexible printed board 10 and a thin film magnetic head portion 20. In order to form such a base material 90, a substrate 81 of glass, ceramic or the like is first prepared. Then, a conductive layer material 82 of Pt, ITO or the like is formed on the surface of the substrate 81. A plating masking material 83 is formed on the surface of the substrate 81 by a heat resistant insulating film or the like, to cover the conductive layer material 82. The plating masking material 83 is provided with a plurality of opening windows 83a, which are arranged with the same pitches as inner lead terminals 2a or externally extracted pattern portions 11c. The surface of the conductive layer material 82 is partially exposed from the opening windows 83a.

Electrolytic plating is performed through the base material 90, to selectively form Au bumps 1b on portions of the conductive layer material 82 which are exposed from the opening windows 83a for serving as conductive paths. The Au bumps 1b are arranged/formed with the same pitches as the inner lead terminals 2a or the externally extracted pattern portions 11c, in thicknesses of about 20 to 30 µm. The Au bumps 1b formed on the base material 90 are aligned with either the inner lead terminals 2a or the externally extracted pattern portions 11c. Due to the same pitches, the Au bumps 1b can be accurately aligned with the inner lead terminals 2a or the externally extracted pattern portions 11c. Thereafter the Au bumps 1b are thermally transferred to the inner lead terminals 2a or the externally extracted pattern portions 11c by thermocompression bonding. Thus, the Au bumps 1b are mounted on the inner lead terminals 2a or the externally extracted pattern portions 11c, thereby forming a conductive layer 1 over the inner lead terminals 2a or the externally extracted pattern portions 11c. The inner lead terminal 2a and externally extracted pattern portion 11c of the first embodiment correspond to the lead terminal 102a and externally extracted pattern portion 111c (FIG. 19) of the second embodiment and the lead terminal 202a and the externally extracted pattern portion 211c (FIG. 21) of the third embodiment, respectively. This conductive layer 1 is particularly effectively applied to the thin film magnetic head structure 50 according to the first embodiment of the present invention. A carrier tape having the Au bump 1b especially formed in the inner lead terminal 2a has been practically used as a carrier tape with transfer bumps. If such a carrier tape with transfer bumps is employed in the thin film magnetic head of the first embodiment, the step of forming the Au bump can be simplified in fabricating the thin film magnetic head.

The conductive layer 1 is not limited to that described above and it may be made of tin or solder, or formed by an Au ball obtained by plating a plastic ball with Au. Alternatively, the conductive layer 1 may be prepared from an anisotropic conductive film having conductivity only in the direction of thickness. Such an anisotropic conductive film may be interposed between the lead terminals 2a, 102a or 202a of the first, second and third embodiments and the externally extracted pattern portions 11c, 111c or 211c to be pressurized and heated, thereby simultaneously bonding the former to the latter. Alternatively, the Au bumps 1a of the externally extracted pattern portions 11c, 111c or 211c of the first, second and third embodiments may be bonded to the respective lead terminals 2a, 102a or 202a one by one through ultrasonic waves or a combination of ultrasonic waves and heat in the so-called single point bonding. In addition, the conductive layer 1 formed by the Au bumps 1a and the like may be provided on either the lead terminals 2a, 102a or 202a or the externally extracted pattern portions 11c, 111c or 211c, to attain a similar effect.

A method of increasing the pitches of the outer lead terminals 2b in the thin film magnetic head structure 50, or to increase the size of the flexible printed board 10 in connection with the external circuit, according to the first embodiment of the present invention is now described.

Figure 23:
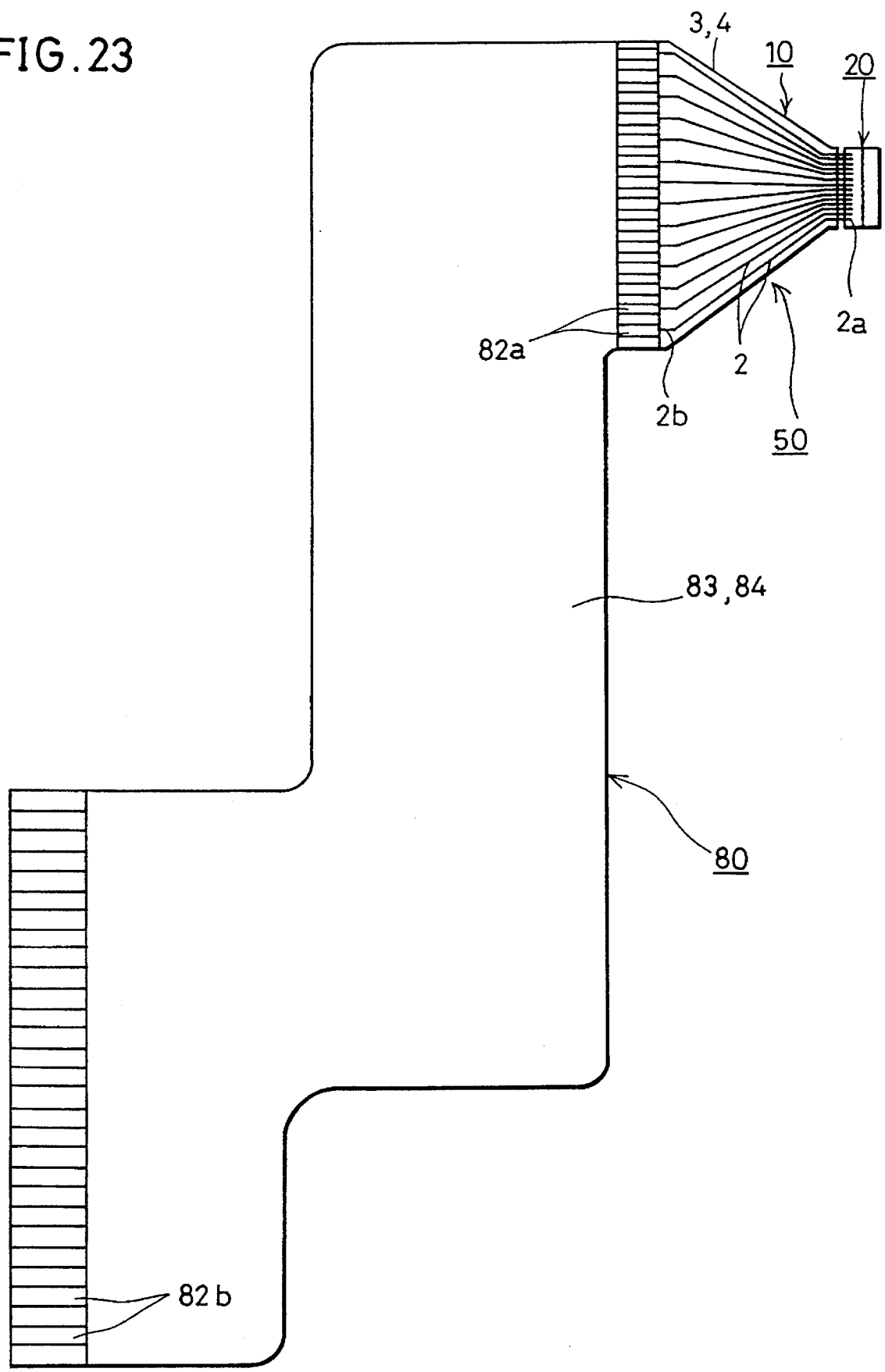
FIG. 23 is a plan view schematically showing the thin film magnetic head structure according to the first embodiment of the present invention, on which a flexible printed board is mounted.

Referring to FIG. 23, the flexible printed board 10 of the thin film magnetic head structure 50 according to the first embodiment of the present invention is obtained from the carrier tape of 35 mm or 70 mm in width, as hereinabove described. Therefore, the dimensions of the flexible printed board 10 are so restricted that it is impossible to increase the pitches of the outer lead terminals 2b to be larger than a certain value. Thus, it may be difficult to electrically connect the flexible printed board 10 to an external substrate in view of distance and space, leading to difficulty in application in a wide range.

In order to solve the aforementioned problem, a second flexible printed board 80 may be connected to the outer lead terminals 2b of the thin film magnetic head structure 50. The second flexible printed board 80 is formed by a copper foil member, which is held between a base film 83 and a cover film 84 to be partially exposed from end portions of these base and cover films 83 and 84. The exposed portions are plated with solder layers. One of the plated end portions of the copper foil member is provided with inner lead terminals 82a, while the other plated end portion is provided with outer lead terminals 82b. The inner lead terminals 82a are arranged with the same pitches as the outer lead terminals 82b of the thin film magnetic head structure 50. Thus, the inner lead terminals 82a can be easily aligned with the outer lead terminals 82b. On the other hand, the outer lead terminals 82b are formed with relatively large pitches as compared with the inner lead terminals 82a. Thus, it is possible to vary the pitches of a portion to be connected with the external substrate by the second flexible printed board 80. Due to employment of such a flexible printed board 80, therefore, it is possible to connect the inventive thin film magnetic head structure 50 to external substrates of various pitches, thereby enlarging the range of application thereof.

The second flexible printed board 80 can be bonded to the thin film magnetic head structure 50 as well as to the external substrate (not shown) through the conductive layer 1 of the present embodiment, which is formed by the Au bumps 1a and the like. This bonding can be done in the form of a carrier tape, and therefore it can be easily done automatically, not resulting in lower yield. Further, the lead substrate portions 110 and 210 are not particularly restricted in size in the thin film magnetic head structures 150 and 250 according to the second and third embodiments of the present invention. Thus, the thin film magnetic head structures 150 and 250 according to the second and third embodiments have extremely high degrees of design, to require no flexible printed board 80.

A head housing case and a head unit which are employable in relation to embodiments of the present invention are now described.

Figure 24:
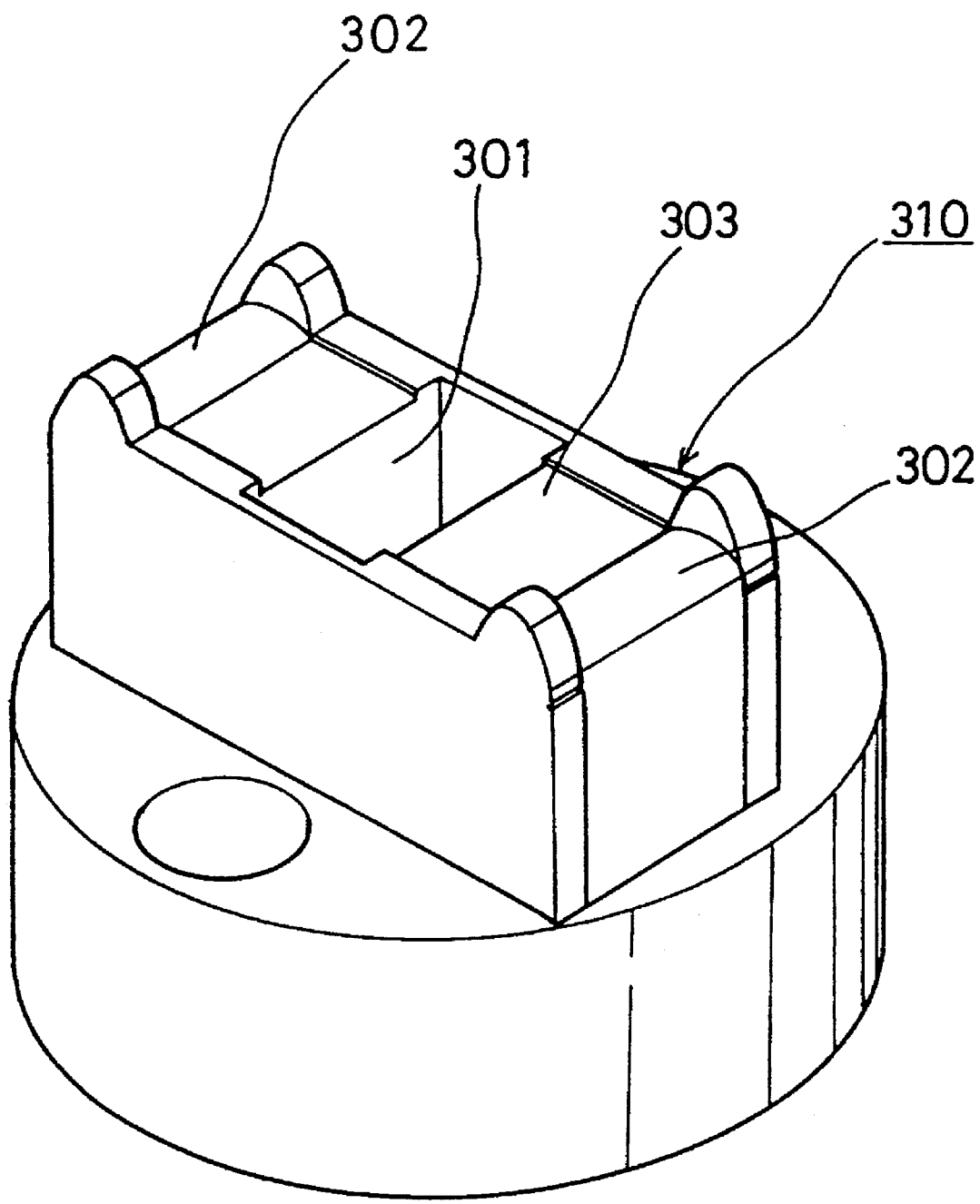
FIG. 24 is a perspective view schematically showing the structure of a head housing case according to an embodiment of the present invention.
Figure 25:
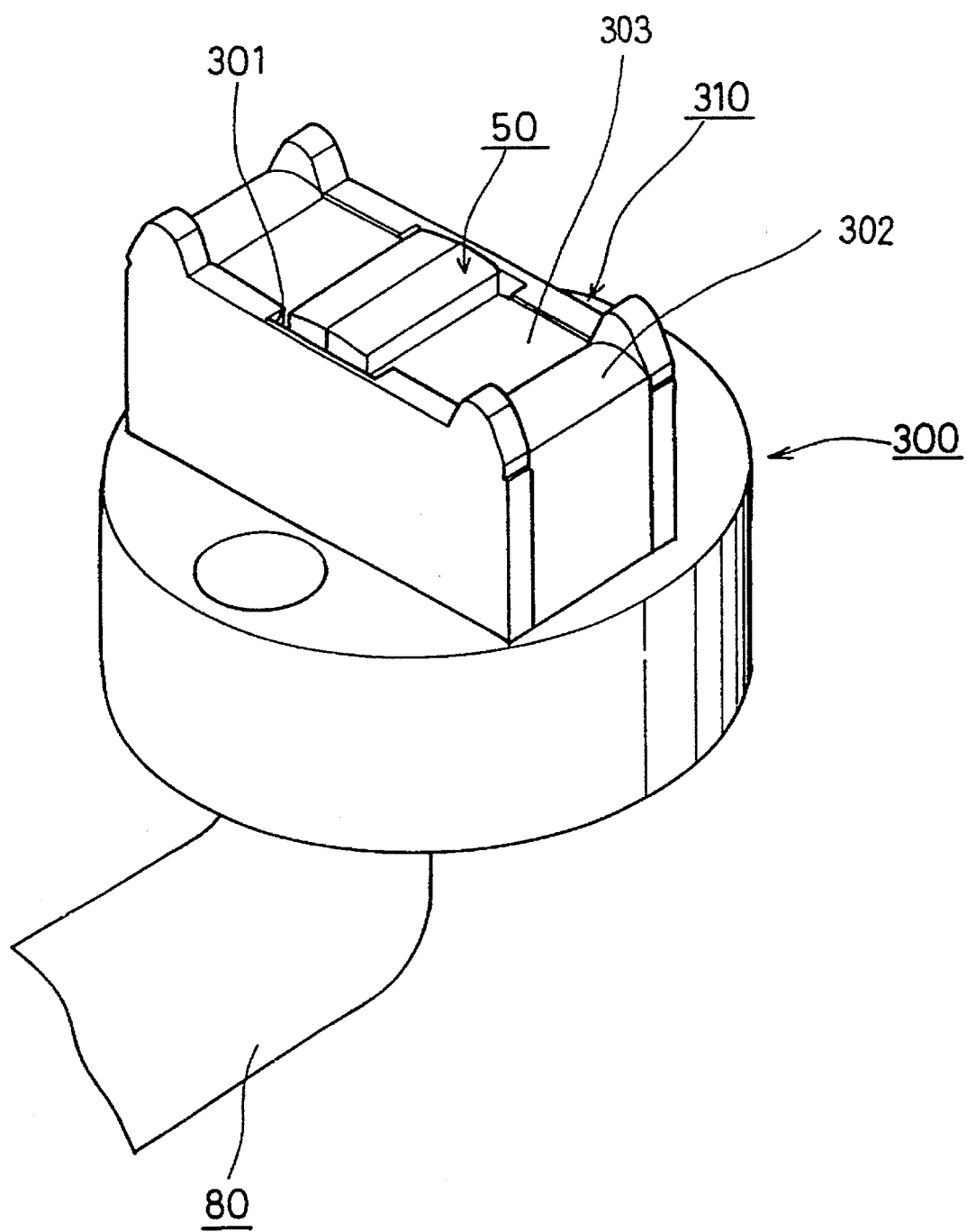
FIG. 25 is a perspective view schematically showing the inventive thin film magnetic head structure for an embodiment of the present invention which is inserted in the head housing case.
Figure 26:
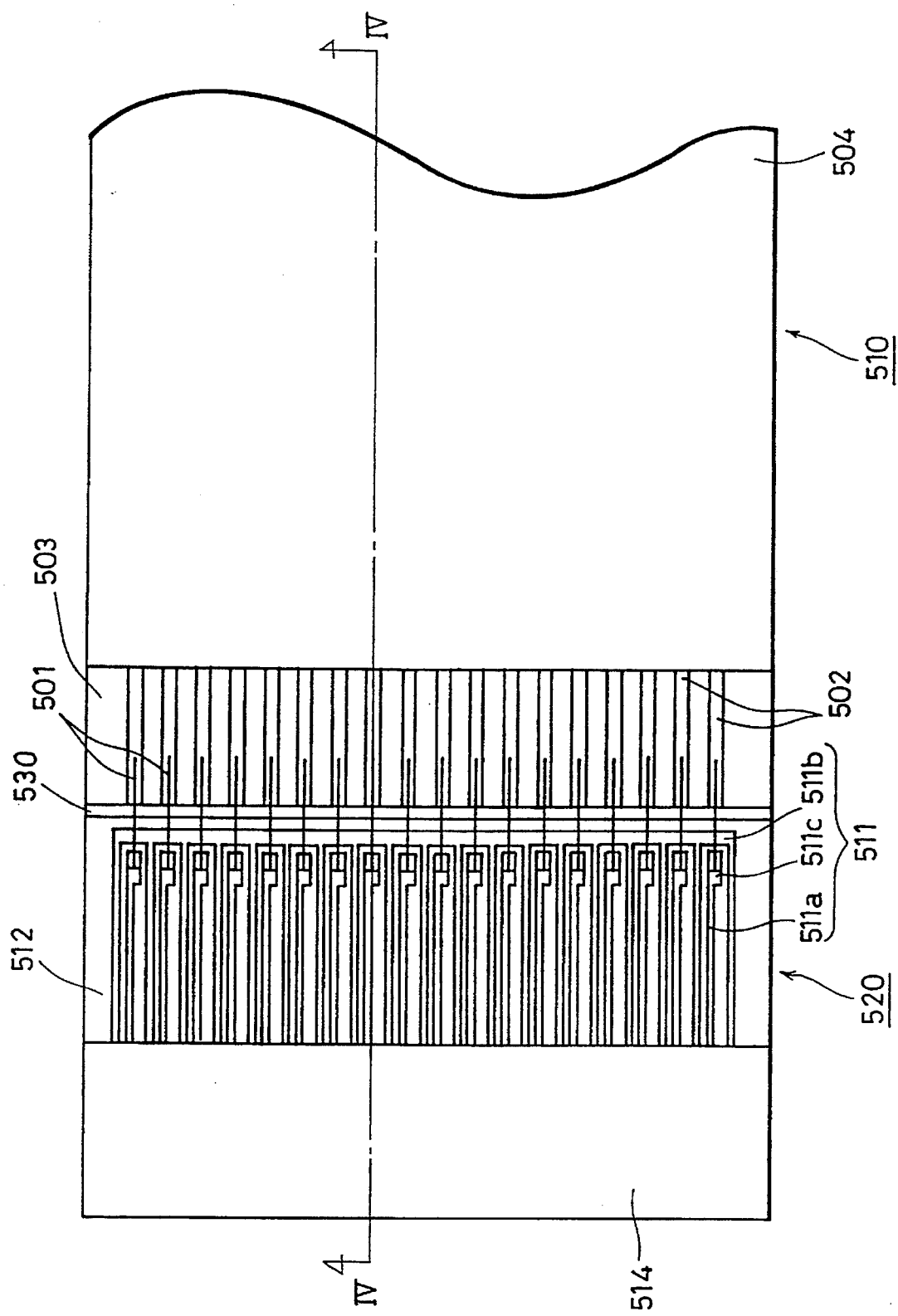
FIG. 26 is a plan view schematically illustrating a conventional thin film magnetic head structure.
Figure 27:
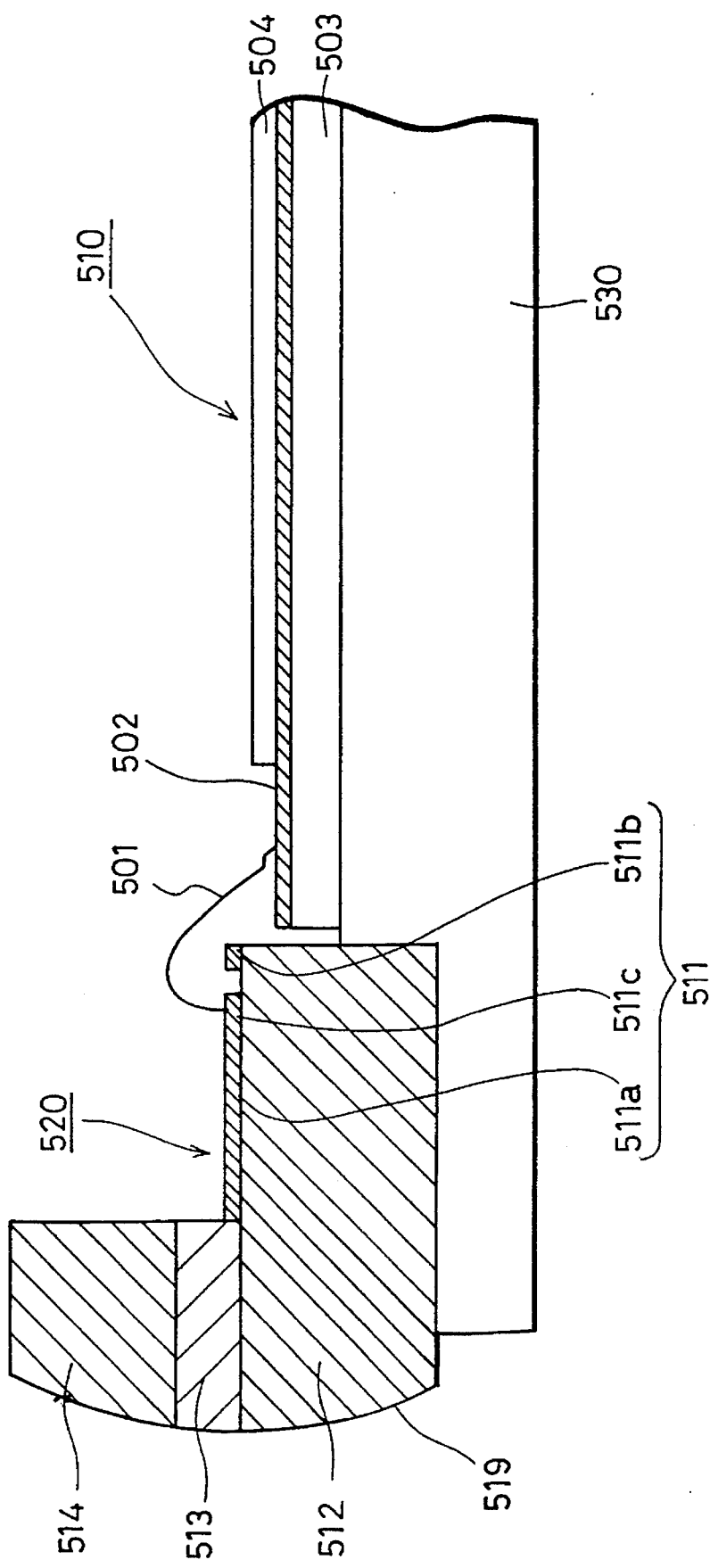
FIG. 27 is a sectional view taken along the line IV—IV in FIG. 26.

Referring to FIG. 24, a head housing case 310 is obtained by integrally forming a tape guide 302 and a head case 303 with resin. The thin film magnetic head structure 50 shown in FIG. 23 is inserted in a head insertion hole 301 of the head housing case 310, thereby obtaining a head unit 300 shown in FIG. 25.

According to the inventive thin film magnetic head structure for the present embodiments, the lead terminals are connected to the corresponding connection terminals through the conductive layer so that the surfaces thereof are opposed to each other. Therefore, the terminal formation substrate can be directly bonded to and supported by the thin film magnetic head substrate. Thus, no support plate is required for supporting these substrates, whereby it is not necessary to locate the thin film magnetic head substrate and the terminal formation substrate on such a support plate in two stages. In other words, the terminal formation substrate may simply be located on the thin film magnetic head substrate, whereby no accurate location is required and the bonding step is simplified.

Further, no insufficient compression bonding is caused by absorption of ultrasonic waves or the like since no wire bonding technique is employed, whereby reliability in electrical connection is improved. In addition, the terminals can be simultaneously connected with each other by pressurization or the like since the surfaces of the terminals are opposed to each other. Thus, the terminals may not be connected in a number of portions dissimilarly to wire bonding, whereby the workability can be improved to a large extent.

According to the inventive method of fabricating a thin film magnetic head structure for the present embodiments, a number of terminal formation substrates are arranged on a tape, so that the same can be continuously located on and bonded to thin film magnetic head substrates. Thus, it is possible to easily automate the steps as compared with a method of locating and bonding terminal formation substrates one by one on and to thin film magnetic head substrates. It is a matter of course that by using a tape, processes such as bonding of connection terminals and leads, resin molding, inspection of both electric and magnetic characteristics of the magnetic head, punching of terminal formation substrates can be carried out in a series of flow, enabling remarkable improvement of production yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic head structure comprising:

a thin film magnetic head substrate having a major surface and including a thin film magnetic head;

a plurality of connection terminals being arranged on said major surface of said thin film magnetic head substrate to extend from an element portion included in said thin film magnetic head;

a plurality of lead terminals arranged in correspondence to respective ones of said connection terminals;

a terminal formation substrate holding respective portions of ones of said lead terminals to expose at least surfaces being opposite to said connection terminals, another portion of said lead terminals including one end of each of said lead terminals projecting from said terminal formation substrate and only the projected one end of each of said lead terminals being opposite to said connection terminals; and a conductive layer corresponding to ones of said connection terminals and said lead terminals, said conductive layer being formed on surfaces of either said connection terminals or said projected one end of said lead terminals, the projected one end of each of said lead terminals being connected to said connection terminals with said conductive layer interposed therebetween by direct application of pressure onto said projected one end of said lead terminals by a bonding tool, wherein the terminal formation substrate is not found on the rear surface of the lead terminals at the projecting portion where the lead terminals are connected to the conductive layer.

2. A thin film magnetic head structure in accordance with claim 1, wherein said lead terminals comprise first portions being held within said terminal formation substrate and second portions extending from said first portions to protrude from said terminal formation substrate so that at least surfaces thereof are exposed.

3. A thin film magnetic head structure in accordance with claim 1, wherein said terminal formation substrate has a surface being opposite to said major surface of said thin film magnetic head substrate, so that said lead terminals are formed on said surface.

4. A thin film magnetic head structure in accordance with claim 1, wherein said terminal formation substrate is formed by a film.

5. A thin film magnetic head structure in accordance with claim 1, wherein said terminal formation substrate includes a protective portion covering said element portion.

6. A thin film magnetic head structure in accordance with claim 1, wherein said conductive layer includes a barrier metal layer, a plating layer formed on the surface of said barrier metal layer, and a gold layer formed on the surface of said plating layer.

7. A thin film magnetic head structure in accordance with claim 1, wherein said conductive layer is formed by a gold layer.

8. A thin film magnetic head structure in accordance with claim 7, wherein said gold layer forms a bump.

9. A thin film magnetic head structure in accordance with claim 7, wherein said connection terminals comprise aluminum and aluminum and gold are bonded at connection portions of said connection terminals and said conductive layer.

10. A thin film magnetic head structure in accordance with claim 7, wherein said gold layer comprises a thickness which is, at least, 20 μm and is, at most, 30 μm.

11. A thin film magnetic head structure in accordance with claim 1, wherein said terminal formation substrate includes:

a first terminal formation substrate being provided with first lead terminals to be connected with said connection terminals, and a second terminal formation substrate being provided with second lead terminals to be connected with said first lead terminals.

12. A method of fabricating a thin film magnetic head structure, comprising the steps of:

(a) preparing a terminal formation substrate for holding at least a portion of each of a plurality of lead terminals to have at least exposed portions, another portion of each of said lead terminals including one end of each of said lead terminals projecting from said terminal formation substrate;

(b) preparing a thin film magnetic head substrate including a thin film magnetic head and having a major surface being provided with a plurality of connection terminals to extend from an element portion included in said thin film magnetic head with only the projected one end of each of said lead terminals being opposite to said connection terminals;

(c) forming a conductive layer on either said projected one end portions of said lead terminals or said connection terminals;

(d) arranging said terminal formation substrate and said thin film magnetic head substrate to oppose said projected one end portion of said lead terminals and said connection terminals to each other; and (e) connecting said projected one end portions of said lead terminals with said connection terminals through said conductive layer, the projected one end of each of said lead terminals being connected to said connection terminals with said conductive layer interposed therebetween by directly applying pressure onto said projected one end portions of each of said lead terminals by a bonding tool, such that the terminal formation substrate is not formed on the rear surface of the lead terminals at the projected one end portion where the lead terminals are connected to the conductive layer.

13. A method of fabricating a thin film magnetic head structure in accordance with claims 12, wherein said step (c) further includes the steps of:

(c)(1) forming a barrier metal layer on surfaces of either said exposed portions of said lead terminals or said connection terminals, (c)(2) forming a plating layer on the surface of said barrier metal layer, and (c)(3) forming a gold layer on the surface of said plating layer.

14. A method of fabricating a thin film magnetic head structure, comprising the steps of:

(a) preparing a tape being provided with a film separately including a plurality of terminal formation substrates arranged in a prescribed direction and a plurality of lead terminals, said film holding thereon said plurality of lead terminals to have at least exposed portions, said tape extending in said prescribed direction, with one end of the lead terminals projecting from at least one terminal formation substrate;

(b) preparing a plurality of thin film magnetic head substrates each including a thin film magnetic head and having a major surface being provided with a plurality of connection terminals to extend from an element portion included in said thin film magnetic head with only the projected one end of each of the lead terminals being opposite to each of the connection terminals;

(c) forming a conductive layer on either said projected one end of said lead terminals or said connection terminals;

(d) arranging each said thin film magnetic head substrate on each said terminal formation substrate being provided on said tape to oppose said projected one end of said lead terminals and said connection terminals to each other;

(e) connecting said projected one end of said lead terminals with said connection terminals through said conductive layer by applying pressure directly onto said projected one end of said lead terminals by a bonding tool, the projected one end of each of the lead terminals being connected with the conductive layer therebetween, such that the terminal formation substrate is not found on the rear surface of the projected one end of said lead terminals of the where the lead terminals are connected to the conductive layer; and (f) separating each said terminal formation substrate from said tape.

15. A method of fabricating a thin film magnetic head structure in accordance with claim 14, further comprising the step of arranging each said thin film magnetic head substrate on each said terminal formation substrate along alignment marks being formed on said tape in correspondence to each said terminal formation substrate being provided thereon.

16. A method of fabricating a thin film magnetic head structure in accordance with claim 14, wherein said step (a) further includes the step of preparing said tape so that a plurality of said terminal formation substrates are formed from a part of said tape.

17. A method of fabricating a thin film magnetic head structure in accordance with claim 14, wherein a plurality of said terminal formation substrates are arranged and formed on said tape in a line along the longitudinal direction of said tape.

18. A method of fabricating a thin film magnetic head structure in accordance with claim 14, wherein a plurality of said terminal formation substrates are arranged and formed on said tape in a plurality of lines along the longitudinal direction of said tape.

19. A method of fabricating a thin film magnetic head structure in accordance with claim 14, further comprising the steps of:
(g) molding connection portions of said lead terminals and said connection terminals after connecting said lead terminals with said connection terminals at said step (e); and
(h) separating said terminal formation substrates from said tape after molding at said step (g).

20. A method of fabricating a thin film magnetic head structure in accordance with claim 14, wherein preparing said tape at said step (a) includes the step of forming a plurality of sprocket holes on a side end of said tape along a prescribed direction.

21. A method of fabricating a thin film magnetic head structure in accordance with claim 14, wherein preparing said tape at said step (a) includes the step of preparing said tape to have a hole from which the end of each of said lead terminals is projected to be exposed.

22. A method of fabricating a thin film magnetic head structure in accordance with claim 14, wherein said conductive layer comprises a gold layer and said conductive layer is formed at said step (c) on the projected portion of one of said lead terminals and said connection terminals and the projected portion of the other of said lead terminals and said connection terminals, on which said conductive layer is not formed, comprises aluminum.

23. A method of fabricating a thin film magnetic head structure in accordance with claim 22, wherein said conductive layer is formed on the exposed portion of said terminals, said connection terminals comprise aluminum, and gold and aluminum are bonded at connection portions of said conductive layer and said connection terminals.

24. A method of fabricating a thin film magnetic head structure in accordance with claim 22, wherein said conductive layer is a bump.

25. A method of fabricating a thin film magnetic head comprising the sequential steps of:
(a) preparing a flexible film carrier tape having a plurality of lead patterns and holes repeatedly formed at a constant pitch in a first direction, a portion of at least one of a plurality of lead terminals forming each of said lead patterns with only one end projecting from one side of one of said holes so as to extend into said hole,
(b) connecting, continuously at each said constant pitch, a predetermined number of thin film magnetic heads at said flexible film carrier tape, the step (b) of continuously connecting a predetermined number of said thin film magnetic heads includes the step of connecting an individual thin film magnetic head, said step of connecting an individual thin film magnetic head including the substeps of,
(i) preparing a thin film magnetic head having a connection terminal formed to correspond to a lead terminal forming said lead pattern,
(ii) arranging said thin film magnetic head and said flexible film carrier tape so that only the projecting one end of said projecting portion of said lead terminal is opposite and aligned to said connection terminal,
(iii) connecting only the projecting one end of said projecting portion of said lead terminal and said connection terminal via a conductive layer by applying pressure directly onto said projecting portion of said lead terminal by a bonding tool such that the flexible film carrier tape is not formed on the rear surface of said lead terminal at the projected one end of said projecting portion where the lead terminal is connected to the conductive layer, and
(iv) forwarding said flexible film carrier tape by a single pitch in said first direction.

26. The method of fabricating a thin film magnetic head according to claim 25, wherein said conductive layer is connected to said connection terminal after being formed on said lead terminal.

27. The method of fabricating a thin film magnetic head according to claim 25, wherein a material of said conductive layer includes Au.

28. The method of fabricating a thin film magnetic head according to claim 25, wherein said step (b) of connecting continuously a predetermined number of thin film magnetic heads comprises the substeps of:
(i) sealing the connecting portion of said projecting portion of said lead terminal and said connection terminal with resin after said lead terminal and said connection terminal are connected, and
(ii) hardening said sealed resin.

29. The method of fabricating a thin film magnetic head comprising the sequential steps of:
(a) preparing a flexible film carrier tape having a plurality of lead patterns and holes repeatedly formed at a constant pitch in a first direction, a portion of each of a plurality of lead terminals forming said lead patterns with only one end projecting from at least one of a plurality of sides of said holes so as to extend into said holes, and
(b) connecting, continuously at each said constant pitch, a predetermined number of thin film magnetic heads arranged corresponding to a side of said holes through which the projecting portions of said lead terminals project at said flexible film carrier tape, the step (b) of continuously connecting includes the substep of connecting an individual thin film magnetic head, said substep of connecting an individual thin film magnetic head including the further substeps of,
(i) preparing a thin film magnetic head having a connection terminal formed to correspond to a lead terminal forming said lead pattern,
(ii) arranging said thin film magnetic head and said flexible film carrier tape so that only the projecting one end of said projecting portion of said lead terminal is opposite and aligned to said connection terminal, (iii) connecting only the projecting one end of said projecting portion of said lead terminal and said connection terminal via a conductive layer by applying pressure directly onto said projecting portion of said lead terminal by a bonding tool such that the flexible film carrier tape is not formed on the rear surface of said lead terminal at the projected one end of said projecting portion where the lead terminal is connected to the conductive layer, and (iv) forwarding said flexible film carrier tape by a single pitch in said first direction.

30. The method of fabricating a thin film magnetic head according to claim 29, wherein said conductive layer is connected to said connection terminal after being formed on said lead terminal.

31. The method of fabricating a thin film magnetic head according to claim 29, wherein a material of said conductive layer includes Au.

32. The method of fabricating a thin film magnetic head according to claim 29, wherein said step (b) of connecting continuously a predetermined number of thin film magnetic heads comprises the substeps of:

(i) sealing the connecting portion of said projecting portion of said lead terminal and said connection terminal with resin after said lead terminal and said connection terminal are connected, and (ii) hardening said sealed resin.

* * * * *